US007968940B2

(12) United States Patent
Udrea

(10) Patent No.: US 7,968,940 B2
(45) Date of Patent: Jun. 28, 2011

(54) INSULATED GATE BIPOLAR TRANSISTOR DEVICE COMPRISING A DEPLETION-MODE MOSFET

(75) Inventor: Florin Udrea, Cambridge (GB)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 348 days.

(21) Appl. No.: 11/863,231

(22) Filed: Sep. 27, 2007

(65) Prior Publication Data
US 2009/0008674 A1     Jan. 8, 2009

Related U.S. Application Data

(60) Provisional application No. 60/947,992, filed on Jul. 5, 2007.

(51) Int. Cl.
*H01L 29/66* (2006.01)

(52) U.S. Cl. ........ 257/332; 257/122; 257/133; 257/138; 257/139; 257/146; 257/147; 257/263; 257/328; 257/329; 257/330; 257/331; 257/341; 257/370; 257/392; 257/E21.382; 257/E21.383; 257/E27.02; 257/E27.036; 257/E27.054; 257/E27.061; 257/E27.064; 257/E29.027; 257/E29.066; 257/E29.183; 257/E29.197; 257/E29.198

(58) Field of Classification Search .......... 257/E21.382, 257/133, 328, 147, 146, 122, 138, 139, E29.027, 257/E29.066, E29.197, E21.383, E29.198, 257/341, 370, 329, 330, 331, 332, E27.061, 257/E27.064, 263, 392, E27.02, E27.036, E27.054, E29.183
See application file for complete search history.

(56) References Cited

U.S. PATENT DOCUMENTS

| | | | |
|---|---|---|---|
| 5,554,862 A | 9/1996 | Omura | |
| 5,689,121 A | 11/1997 | Kitagawa | |
| 5,838,026 A | 11/1998 | Kitagawa | |
| 5,861,638 A | 1/1999 | Oh | |
| 6,236,069 B1 * | 5/2001 | Shinohe et al. | 257/138 |
| 6,809,349 B2 | 10/2004 | Yamaguchi | |
| 7,170,106 B2 | 1/2007 | Yamaguchi | |

* cited by examiner

*Primary Examiner* — Matthew E Warren
*Assistant Examiner* — David Z Chen
(74) *Attorney, Agent, or Firm* — Winston Hsu; Scott Margo

(57) ABSTRACT

Double gate IGBT having both gates referred to a cathode in which a second gate is for controlling flow of hole current. In on-state, hole current can be largely suppressed. While during switching, hole current is allowed to flow through a second channel. Incorporating a depletion-mode p-channel MOSFET having a pre-formed hole channel that is turned ON when 0V or positive voltages below a specified threshold voltage are applied between second gate and cathode, negative voltages to the gate of p-channel are not used. Providing active control of holes amount that is collected in on-state by lowering base transport factor through increasing doping and width of n well or by reducing injection efficiency through decreasing doping of deep p well. Device includes at least anode, cathode, semiconductor substrate, n− drift region, first & second gates, n+ cathode region; p+ cathode short, deep p well, n well, and pre-formed hole channel.

9 Claims, 28 Drawing Sheets

INSULATED GATE BIPOLAR TRANSISTOR DEVICE COMPRISING A DEPLETION-MODE MOSFET

CROSS REFERENCE TO RELATED APPLICATIONS

This application claims the benefit of U.S. Provisional Application No. 60/947,992, filed Jul. 5, 2007.

BACKGROUND OF THE INVENTION

1. Field of the Invention

This invention relates to an insulated gate bipolar transistor, and in particular, to a double gate insulated gate bipolar transistor (DG IGBT), and a method of manufacturing thereof.

2. Description of the Prior Art

An insulated gate bipolar transistor (IGBT) features a MOS gate for high impedance voltage-control and bipolar conduction for reducing the drift on-state resistance (through 'conductivity modulation'). It can be seen as a successful combination between a power MOSFET and a bipolar transistor.

Various versions of IGBTs have been developed. One is a trench IGBT (FIG. 1), which is a variant of an IGBT featuring a plurality of vertical channels 50a. Referring to FIG. 1, the trench IGBT device features an n− drift region where the voltage is supported during the blocking mode in the off-state. The doping and depth of this region are given by the breakdown rating. A p well is placed on top of the drift region and is shorted to the cathode via a p+ region. The insulated gate is made of a thin oxide layer and a polysilicon layer, where both are placed inside a trench. This insulated gate is acting as the MOSFET structure gate. The n+ cathode layer also acts as the source for the MOSFET and the n− drift region becomes the drain. Upon application of a positive voltage between the gate and the cathode, which is greater than the threshold voltage, a channel 50a is formed inside the p-well at the interface with the gate oxide, which allows transport of the electrons from the n+ cathode into the drift region. This drift region is also the base of a pnp transistor featuring the p_ anode as its emitter, the n-drift region as its base, and the p well as its collector. During the on-state, high carrier injection of holes from the anode layer (i.e. emitter of the pnp transistor) and electron injection from the channel and the accumulation layer formed around the gate at the surface of the n-drift region yields conductivity modulation of the drift region; and as a result, a substantial decrease in the on-state resistance is provided. As in the Trench MOSFET, the n+ sources are self-aligned to the trench or displaced around the trench; and the overall dimensions of the cell can be made much smaller than in conventional IGBTs. This means that the channel density Z/A (where A is the active area of the device and Z is the perimeter of the channel 50a) is considerably larger than that found in the conventional IGBT. This yields a smaller channel resistance; and as a result, a smaller on-state voltage drops is present in the Trench IGBT when two devices are operating at the same current densities. The trench IGBT structure has also a more one dimensional natural flow, thereby avoiding bends and removing the parasitic JFET effect.

Referring to FIG. 2, a simple equivalent circuit model for the trench IGBT as shown in FIG. 1 or indeed any common IGBTs is that of an n-channel MOSFET driving the wide base of a pnp bipolar transistor. It depicts the pnp transistor whose base is connected to the MOSFET structure. This MOSFET is an enhancement mode MOSFET. The small p base resistor models the flow of the hole current in the p well. Under heavy modulation during the on-state, the base of the pnp transistor, which is called the drift region of the device, becomes highly conductive, thus minimizing the voltage drop across it. The n-channel MOSFET is active on positive signals being applied to the gate, and can turn into a p-channel when negative voltages are being applied.

Recently, many different types of IGBT have been developed, such as, for example, the following: 1) Punch-Through IGBT (PT IGBT) based on an epitaxial drift region grown on a highly doped substrate; 2) "Non Punch Through" IGBT (NPT-IGBT) based on homogeneous substrate material (float zone) having increased robustness and improved plasma distribution which overall cuts the switching losses in spite of its increased drift length; 3) Soft Punch Through IGBT (SPT-IGBT), also known as Field Stop IGBT (FS-IGBT) based on having a punch-through type drift region (similarly to that of the PT IGBT) but having a lightly doped buffer and a lightly doped and transparent anode instead.

Several recently reported IGBT structures which aim to improve the conductivity modulation at the cathode side of the drift region are as follows: 4) Injection Enhanced Gate Transistor (IEGT), which is a Trench IGBT with a lower n+ and p+ cathode contact area; 5) Carrier Stored Trench Bipolar Transistor (CSTBT) is a device featuring a 'real' PIN diode as it has an 'n' layer placed under the p-well; 6) High Conductivity IGBT (HiGT) featuring an n layer around the p-well to stop the holes reaching the cathode shorts and thus enhancing the electron injection at the top side of the drift region; 7) and Double Gate IGBT (DG IGBT), which includes devices having an extra cathode gate for enhanced modulation.

The IGBT is controlled via an n-channel MOSFET gate for turn-on and turn-off. To speed up the device, it is known that a p-channel MOSFET can be formed by applying a negative voltage to the gate of the MOSFET. This p-channel gate can be physically the same gate as the n-channel gate, but is operated with the opposite polarity or indeed can physically be a different gate, in which case, the device can be regarded as a double gate IGBT (DG IGBT).

In addition to the more detailed description of many of the various types of IGBT species above, one should also possess an understanding of the more generic form of transistors of which the IGBTs belong, namely, a MOSFET. The following descriptions refers now to a MOSFET, as this is a key component structure of the IGBT and plays an important role in the description of the invention.

The MOSFET (Metal-Oxide-Semiconductor Field Effect Transistor) is a semiconductor structure comprising two regions of a specified conductivity, known as a source region and a drain region, and are separated from each other by a another region of opposite conductivity, known as a base region or base layer. Charge carriers of the specified conductivity type can flow between the source and drain through a gate-controllable channel of the specified conductivity type extending across a surface of the opposite conductivity base layer. The gate is an electrically conductive electrode, commonly formed of polysilicon material situated over an electrically insulating layer of oxide over the semiconductor surface which contains the channel. Conductivity of the channel, and hence the current flowing between source and drain regions, is changed as changes are made to the voltage at which the gate is biased relative to the base region/layer. The device is known as an n-channel or p-channel MOSFET in accordance with the conductivity type of the source, drain, and the channel regions. The device is known as an enhancement-mode or depletion-mode MOSFET in accordance to whether an applied gate bias produces an enhancement or depletion of the conductivity of the channel.

An enhancement-mode structure is normally off, and does not conduct current unless a bias voltage is applied to the gate with respect to the source.

A depletion-mode MOSFET structure contains a pre-formed channel that is normally on, and will conduct current when no bias voltage or zero bias is applied to the gate, but this current flow can be interrupted by an appropriate bias voltage applied to the gate with respect to the source.

Current flowing in a semiconductor can consist of negative charge carriers (electrons), or positive charge carriers (holes), or both. Unipolar conduction consists of only one species of charge carrier, and bipolar conduction consists of both species. Conduction in an N channel MOSFET is unipolar, since it consists of the flow of only electrons. Similarly, conduction in the p channel MOSFET is unipolar, since it consists of the flow of only holes.

As already mentioned, an IGBT incorporates an enhancement mode n-channel MOSFET to drive the base of a pnp bipolar transistor. As known in state of the art, a double gate IGBT can additionally incorporate an enhancement mode p-channel gate, that helps to speed up the hole removal upon applying a negative voltage between the gate and the source/cathode.

FIG. 3 illustrates a conventional double gate device as described in U.S. Pat. No. 5,554,862. The aforementioned conventional double gate device is an IGBT device comprising a p+ emitter layer 1a, a high-resistance n– base layer 3a, a second p base layer 4b, an n buffer layer 2a, a p emitter layer 1a, a trench structure 20a, a first p base layer 4a, an insulating film 22a, a trench 21a, a polysilicon layer 23a, a first electrode 10a, a gate insulating film 9a, a p+ source layer 12a, a second gate electrode 11c, a cathode electrode 8a, an anode electrode 7a, a cathode emitter electrode 19a, a high-concentration p+ layer 27a, and a vertical groove portion 66a.

The aforementioned conventional double gate device in FIG. 3 requires a second, a p-channel, and a gate operating only when a negative voltage with respect to the cathode terminal, K is applied to it. As a result, there is a need for having complex and expensive drive circuits for providing the negative voltages to the second (p-channel) gate 11c.

An equivalent circuit model of the device shown in FIG. 1 is schematically shown in FIG. 4. Referring to FIG. 4, a p-channel MOSFET is active on negative signals when applied to its gate. Meanwhile, an n-channel MOSFET is active on positive signals when applied to its gate. It is also an equivalent circuit model of the device shown in FIG. 3 when the two insulated gates are separate (G1 and G2). In addition to the equivalent circuit model as shown in FIG. 2, the equivalent circuit model in FIG. 4 features a second gate. This second gate is part of an enhancement mode p-channel transistor that is active when a negative voltage is applied to the second gate with respect to the cathode. This is of help to speed up the extraction of excess charge from inside the drift region and thus reduce the turn-off time of the device. However, the presence of both positive and negative gate voltages (e.g. +15 V and –15 V) results in a significant increase in the complexity and cost of the drive system for this device (not shown).

For other IGBTs using the enhanced injection concept, large p resistors placed along large surface tracks in the third dimension (as described in U.S. Pat. No. 7,170,106 and U.S. Pat. No. 6,809,349) tend to occupy considerably more space than the pnp transistor, as well as creating distributed paths for the holes which can lead to the non-uniform modulation of the drift region.

In short, the conventional IGBT devices at a particular set of anode injection and breakdown ability conditions do not provide adequate on-state and turn-off characteristics, and may suffer from higher on-state saturation current.

SUMMARY OF THE INVENTION

An objective of the present invention is to provide a double gate insulated gate bipolar transistor having both gates referred to a cathode, in which a second gate is usable for controlling the flow of the hole current. In the on-state, the hole current can be largely (but not totally) suppressed for maximizing the electron injection at the cathode side of the n– drift region; while during switching, the hole current is allowed to flow through a second channel to ensure the effective removal of the plasma accumulated in the n– drift region.

Another object of the present invention is to forego having to provide negative voltages to the second gate (p-channel depletion mode MOSFET) by incorporating a second MOSFET (depletion-mode p-channel MOSFET) having a pre-formed/buried hole channel that is turned ON when the second gate-cathode potential drop is zero or at relatively low positive voltages, below a specified threshold voltage.

Another object of the present invention is to provide an active control of the amount of holes that is collected in the on-state by the cathode short by forcing the hole current through an active, low gain, pnp transistor. By lowering the base transport factor for the pnp transistor placed at the cathode side of the n– drift region, one can lower the amount of holes that are injected from the deep p well adjacent to the drift region and collected by the p+ cathode short. The lowering of the base transport factor can be done through increasing the doping and the width of the n well which acts as the base of the above mentioned pnp transistor or by reducing the injection efficiency through decreasing the doping of the deep p well which acts as the p type emitter layer of the above mentioned pnp transistor. The partial suppression of holes collected by the cathode short by means of lowering the gain of the pnp transistor provides higher electron injection in the drift region leading to enhanced excess charge and hence enhanced conductivity modulation at the cathode side of the n– drift region.

Another object of the present invention is to permit optimization of the on-state voltage drop, the on-state saturation current, the turn-off speed and the Safe Operating Area (SOA) of the IGBT device using the layout scaling of the perimeters of the enhancement mode n-channel of the first gate and the depletion mode p-channel of the second gate.

According to a first aspect of the invention, an insulated gate bipolar transistor (IGBT) device includes an anode terminal, a cathode terminal, a semiconductor substrate, an n-type buffer layer (optional), an n– drift region, a first gate, a second gate, an n+ cathode region, a p+ cathode short region, a deep p well, an n well, a p+ diffusion region, a p+ layer disposed surrounding a metal plug, a pre-formed hole channel at a surface of the n well underneath the second gate, in which the first insulated gate is a trench gate, the second insulated gate is a planar gate adjacent to the cathode, and the first gate and the second gate are electrically connected together, and are referred to the cathode terminal.

According to a second aspect of the invention, there is provided an insulated gate bipolar transistor (IGBT) device comprising an anode terminal, a cathode terminal, a semiconductor substrate, an n-type buffer layer (optional), an n– drift region, a first gate, a second gate, an n+ cathode region, a p+ cathode short region, a deep p well, an n well, a shallow p well, a pre-formed (buried) hole channel, in which the first gate and the second gate are a plurality of insulated trench gates which are electrically connected together, and are referred to the cathode; and the pre-formed hole channel is disposed vertically along the trench wall of the second gate, and along a side surface of the n well, the shallow p well, and the deep p well.

According to a third aspect of the invention, there is provided an equivalent circuit model of the IGBT device which includes a cathode, an anode, a first MOSFET comprising a first gate, a second MOSFET comprising a second gate, a first bipolar pnp transistor, and a second bipolar pnp transistor, in which the first bipolar pnp transistor is disposed between the collector of the second bipolar transistor and the cathode terminal, and where the first MOSFET is comprised of two n-channel MOSFETs connected in series and acting as a single n-channel enhancement MOSFET, and where the second gate is part of a p-channel depletion mode MOSFET (second MOSFET); the threshold voltage of the first MOSFET is greater than zero and greater than the threshold of the second MOSFET but is below the operating gate voltage; the threshold voltage of the second MOSFET is greater than zero but is below the threshold voltage of the first MOSFET; the first gate is used to turn-on and maintain the on-state of the IGBT device, and the second gate is used to remove holes rapidly during the turn-off by bypassing the first bipolar transistor, and is preferably used via the pre-formed hole channel to clamp the collector of the second bipolar pnp transistor (i.e. the deep p well) to the potential of the cathode during the voltage blocking mode in the off-state.

According to a fourth aspect of the invention, there is provided an equivalent circuit model of the IGBT device which includes a cathode, an anode, a first MOSFET including a first gate, a second MOSFET including a second gate, a first bipolar pnp transistor, a second bipolar pnp transistor, and a third npn bipolar transistor, in which the third npn bipolar transistor is coupled to the second bipolar pnp transistor in a positive feedback to form a thyristor during on-state operation, and where the first MOSFET is comprised of two n-channel MOSFETs connected in series and acting as a single n-channel enhancement MOSFET, and the second gate is a p-channel depletion mode MOSFET (second MOSFET); and the threshold voltage of the first MOSFET is greater than zero and greater than the threshold of the second MOSFET, but is below the operating gate voltage, and the threshold voltage of the second MOSFET is greater than zero but below the threshold voltage of the first MOSFET and where the first gate is used to turn-on and maintain the on-state of the IGBT device; and the second gate is used to remove holes rapidly during the turn-off by bypassing the first bipolar pnp transistor and extracting charge from the base of the third npn bipolar transistor and where the second gate is also preferably used via the pre-formed hole channel to clamp the collector of the second bipolar pnp transistor to the potential of the cathode during the voltage blocking mode in the off-state.

According to a fifth aspect of the invention, there is provided an IGBT device where upon an application of a common 0V to the first gate and the second gate (or a voltage greater than zero volts but lower than the threshold voltage of the second MOSFET), the first MOSFET is turned OFF and the second MOSFET is turned ON, thereby allowing access for hole draining from the p type base layer (deep p well) during the turn-off mode, and the potential of the p-base (deep p well) is clamped to that of the cathode terminal during the off-state mode.

According to a sixth aspect of the invention, there is provided an IGBT device further including a first bipolar pnp transistor, which is formed using the deep p well as the emitter, the n well as the base, and the p+ cathode as the collector layer. The gain of the first bipolar pnp transistor is controlled by controlling the thickness and doping of the base of the first bipolar pnp transistor and the injection efficiency of the emitter-base junction.

According to a seventh aspect of the invention, there is provided a an IGBT device where the collection of holes is partially blocked by or made resistive via a first bipolar pnp transistor in the form of a low gain pnp transistor during the on-state of the IGBT device circuit.

According to an eighth aspect of the invention, there is provided an IGBT device where the first bipolar pnp transistor is largely bypassed during the off-state and turn-off of the IGBT device.

According to a ninth aspect of the invention, there is provided a method for manufacturing an IGBT device comprising of the following: a p+ substrate layer is provided on a back surface of a semiconductor substrate, and an n buffer layer, a n− drift region, a deep p well layer, an n well layer are sequentially formed on a front surface of the p+ substrate layer; a trench wherein extending through the n well layer, the deep p well layer, and reaching the n− drift region is formed; a p well layer is selectively formed on a portion of the n well layer; a pre-formed hole channel comprising of a p-diffusion layer is selectively formed inside the trench by means of an angle implantation of p-type impurities through the trench before being filled with any materials; a gate insulating film is formed on the inner surface of the trench; a polycrystalline silicon film is selectively deposited to fill the trench for forming a gate; excess polycrystalline silicon film disposed above the front surface is removed; an n+ cathode region and a p+ cathode short region are selectively formed, respectively; an insulating oxide film is formed on the front surface to cover and electrically isolate the gate electrodes of the gate; the cathode terminal is selectively formed on the front surface; and an anode terminal is formed on the back surface of the IGBT device.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
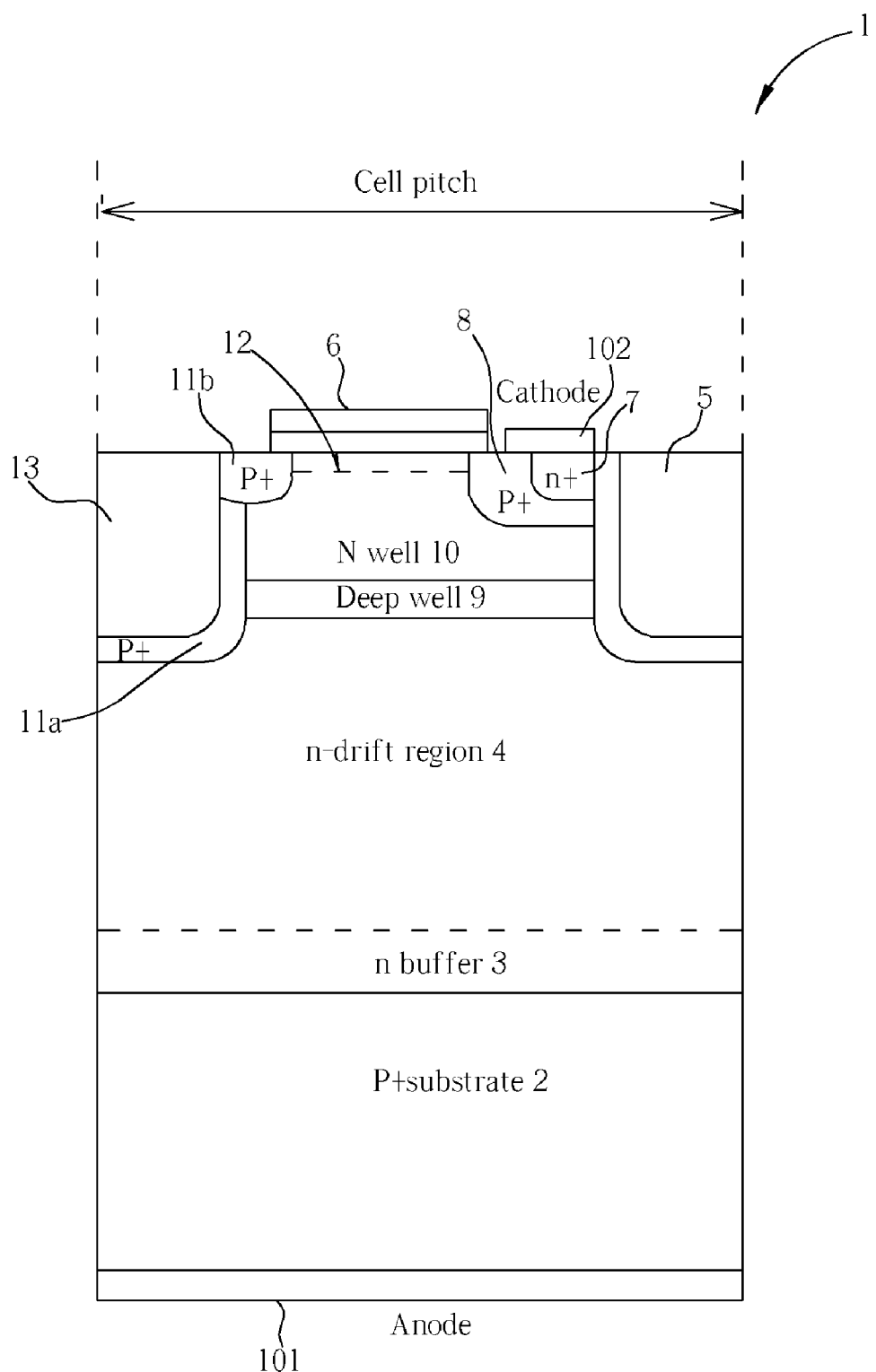
FIG. 5 is a cross-section view showing an insulated gate bipolar transistor (IGBT) device according to a first embodiment of the present invention.

Referring to FIG. 5, an insulated gate bipolar transistor (IGBT) device 1 according to a first embodiment of the present invention includes an anode terminal 101, a cathode terminal 102, a semiconductor substrate, 2, an n-type buffer layer 3 (optional), an n– drift region, 4, a first gate 5, a second gate 6, an n+ cathode region, 7, a p+ cathode short region 8, a deep p well 9, an n well 10, a p+ diffusion region 11b, a p+ layer 11a disposed surrounding a metal plug 13, a pre-formed hole channel 12 at a surface of the n well 10 underneath the second gate 6, in which the first insulated gate 5 is a trench gate, the second (insulated) gate 6 is a planar gate adjacent to the cathode 102, and the first gate 5 and the second gate 6 are coupled together, and are referred to the cathode terminal 102.

Figure 6:
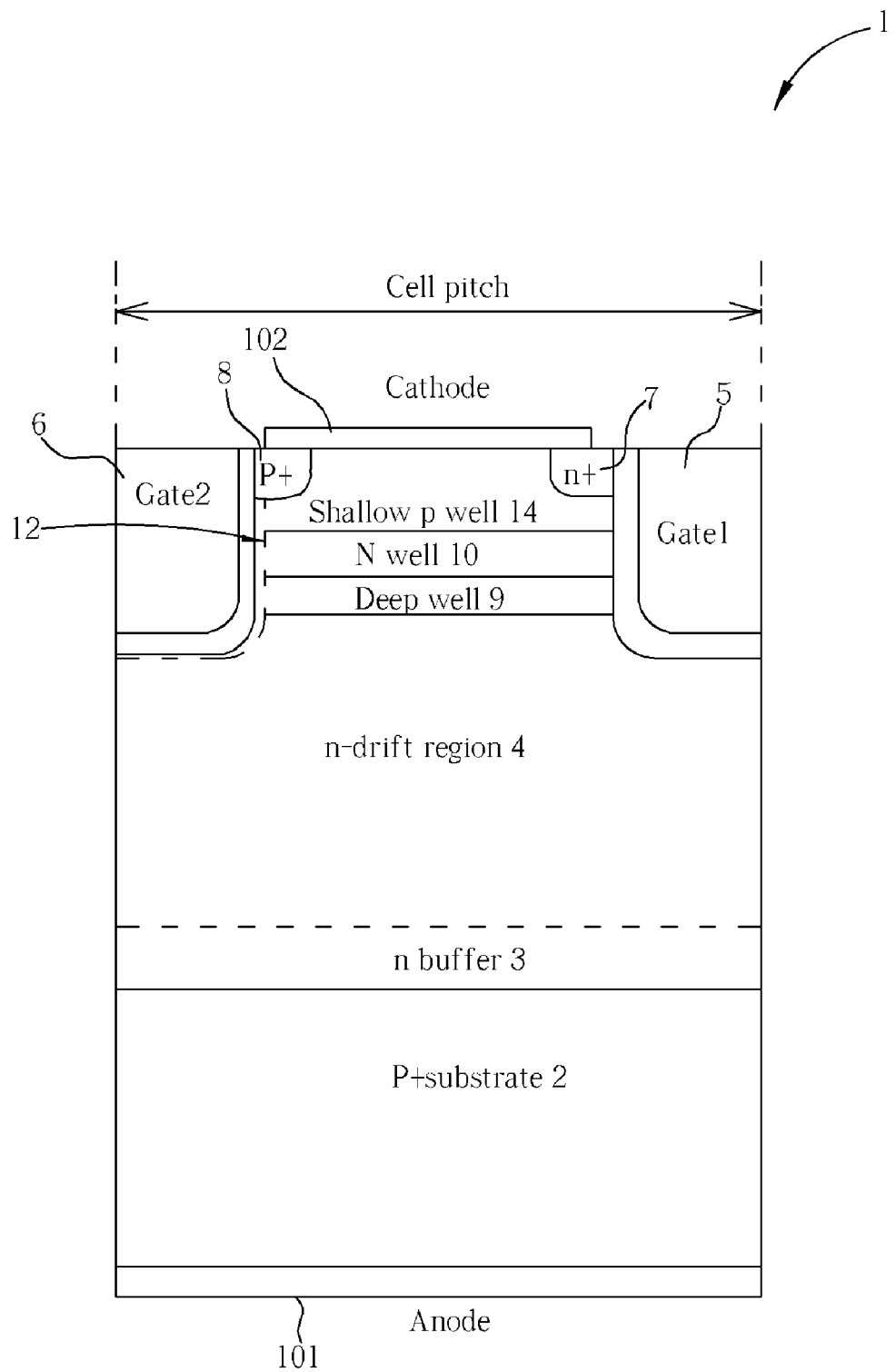
FIG. 6 is a cross-section view showing an insulated gate bipolar transistor (IGBT) device according to a second embodiment of the present invention.

Referring to FIG. 6, there is provided an insulated gate bipolar transistor (IGBT) device 1 according to a second embodiment of the present invention comprising an anode terminal 101, a cathode terminal 102, a semiconductor substrate 2, an n-type buffer layer 3 (optional), an n– drift region 4, a first gate 5, a second gate 6, an n+ cathode region 7, a p+ cathode short region 8, a deep p well 9, an n well 10, a shallow p well 14, a pre-formed (buried) hole channel 12, in which the first gate 5 and the second gate 6 are a plurality of insulated trench gates which are coupled together, and are referred to the cathode 102; and the pre-formed hole channel 12 is disposed vertically along the trench wall of the second gate 6, and along a side surface of the n well 10, the shallow p well 14, and the deep p well 9.

Figure 7:
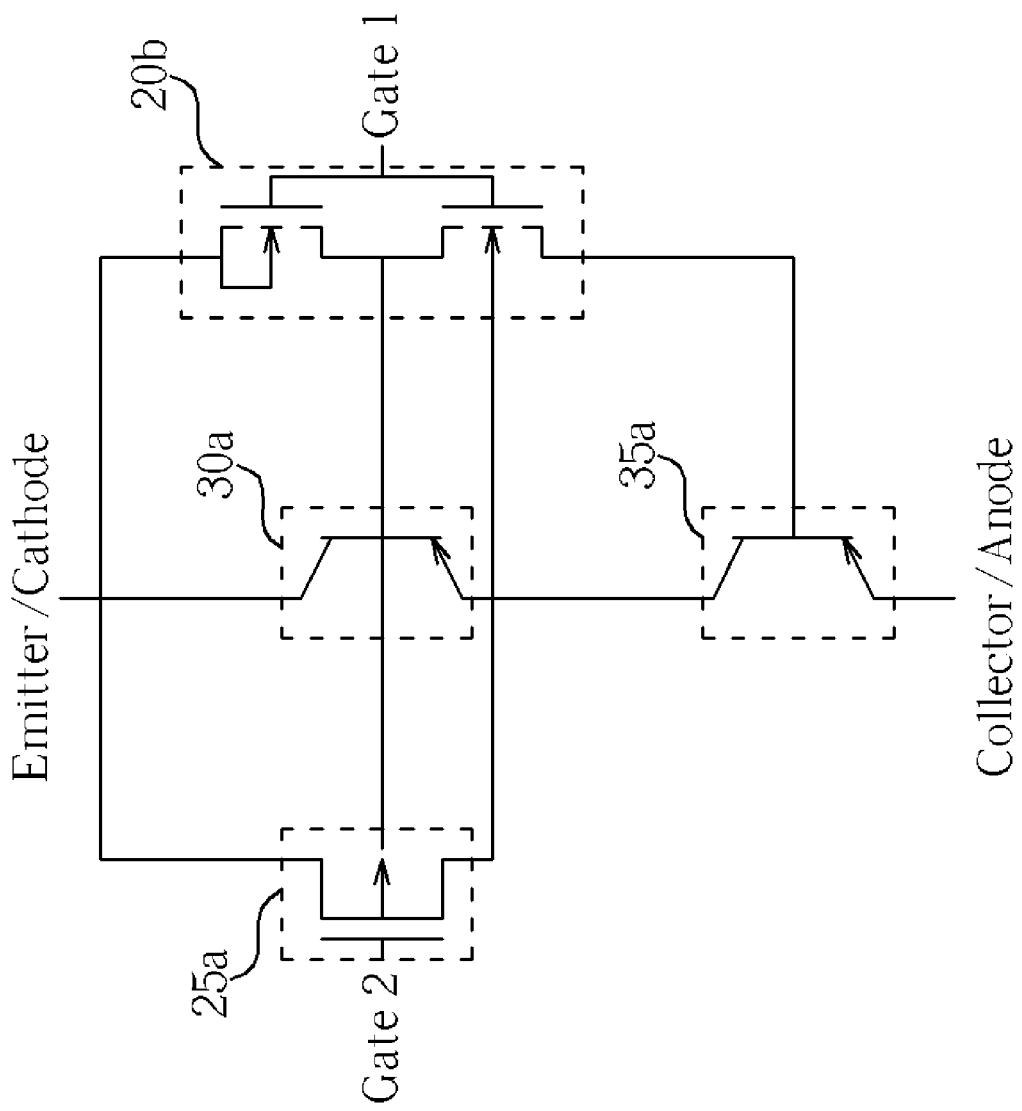
FIG. 7 shows an equivalent circuit model of the IGBT device according to the first embodiment of the present invention.

Referring to FIG. 7, there is provided an equivalent circuit model of the device shown in FIG. 5 for the first embodiment, which includes a cathode, an anode, a first MOSFET 20b comprising a first gate, a second MOSFET 25a comprising a second gate, a first bipolar pnp transistor 30a, and a second bipolar pnp transistor 35a, in which the first bipolar pnp transistor 30a is disposed between the collector of the second bipolar transistor 35a and the cathode terminal, and where the first MOSFET 20b is comprised of two n-channel MOSFETs connected in series and acting as a single n-channel enhancement MOSFET, and where the second gate is a p-channel depletion mode MOSFET (second MOSFET 25a); the threshold voltage of the first MOSFET 20b is greater than zero and greater than the threshold of the second MOSFET 25a but is below the operating gate voltage; the threshold voltage of the second MOSFET 25a is greater than zero but is below the threshold voltage of the first MOSFET 20b; the first gate is used to turn-on and maintain in the on-state the IGBT device as shown in FIG. 5, and the second gate is used to remove holes rapidly during the turn-off by bypassing the first bipolar transistor 30a, and is preferably used to clamp the collector of the second bipolar pnp transistor 35a to the potential of the cathode during the voltage blocking mode in the off-state.

Figure 8:
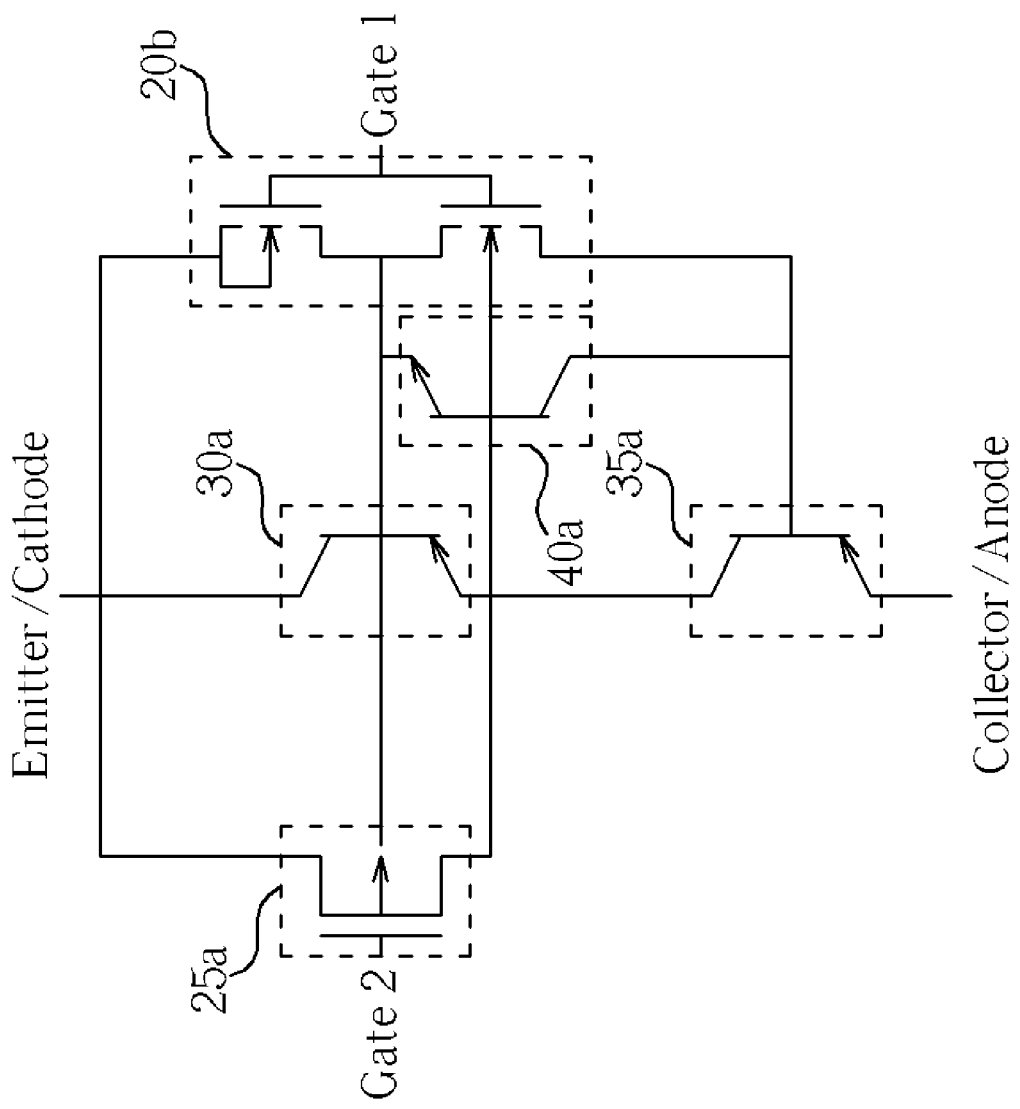
FIG. 8 shows an equivalent circuit model of the IGBT device according to the second embodiment of the present invention.

Referring to FIG. 8, there is provided an equivalent circuit model of the device shown in FIG. 6 for the second embodiment, which includes a cathode, an anode, a first MOSFET 20b including a first gate, a second MOSFET 25a including a second gate, a first bipolar pnp transistor 30a, a second bipolar pnp transistor 35a, and a third npn bipolar transistor 40a, in which the third npn bipolar transistor 40a is coupled to the second bipolar pnp transistor 35a in a positive feedback to form a thyristor during on-state operation, and where the first MOSFET 20b is comprised of two n-channel MOSFETs connected in series and acting as a single n-channel enhancement MOSFET, and the second gate is a p-channel depletion mode MOSFET (second MOSFET 25a); and the threshold voltage of the first MOSFET is greater than zero and greater than the threshold of the second MOSFET 25a, but is below the operating gate voltage; and the threshold voltage of the second MOSFET 25a is greater than zero but below the threshold voltage of the first MOSFET 20b, and where the first gate is used to turn-on and maintain the on-state of the IGBT device shown in FIG. 6; and the second gate is used to remove holes rapidly during the turn-off by bypassing the first bipolar pnp transistor 30a and extracting charge from the base of the third npn bipolar transistor 40a and where the second gate is also preferably used to clamp the collector of the second bipolar pnp transistor 35a to the potential of the cathode during the voltage blocking mode in the off-state.

Referring to both FIGS. 7 & 8, there is provided an IGBT device according to a third embodiment of the present invention where upon an application of a common 0V to the first gate and the second gate (or a voltage greater than zero volts but lower than the threshold voltage of the second MOSFET), the first MOSFET 20b is turned OFF and the second MOSFET 25a is turned ON, thereby allowing access for hole draining from the p type base layer, the deep p well, during the turn-off mode, and the potential of the p-base is clamped to that of the cathode during the off-state mode.

Referring to both FIGS. 5 & 6, there is provided an IGBT device according to the first and second embodiments, further including a first bipolar pnp transistor 30a, which is formed using the deep p well 9 as the emitter, the n well 10 as the base, and the p+ cathode 8 as the collector layer. The gain of the first bipolar pnp transistor 30a is controlled by controlling the thickness and doping of the base of the first bipolar pnp transistor 30a and the injection efficiency of the emitter-base junction.

Figure 9:
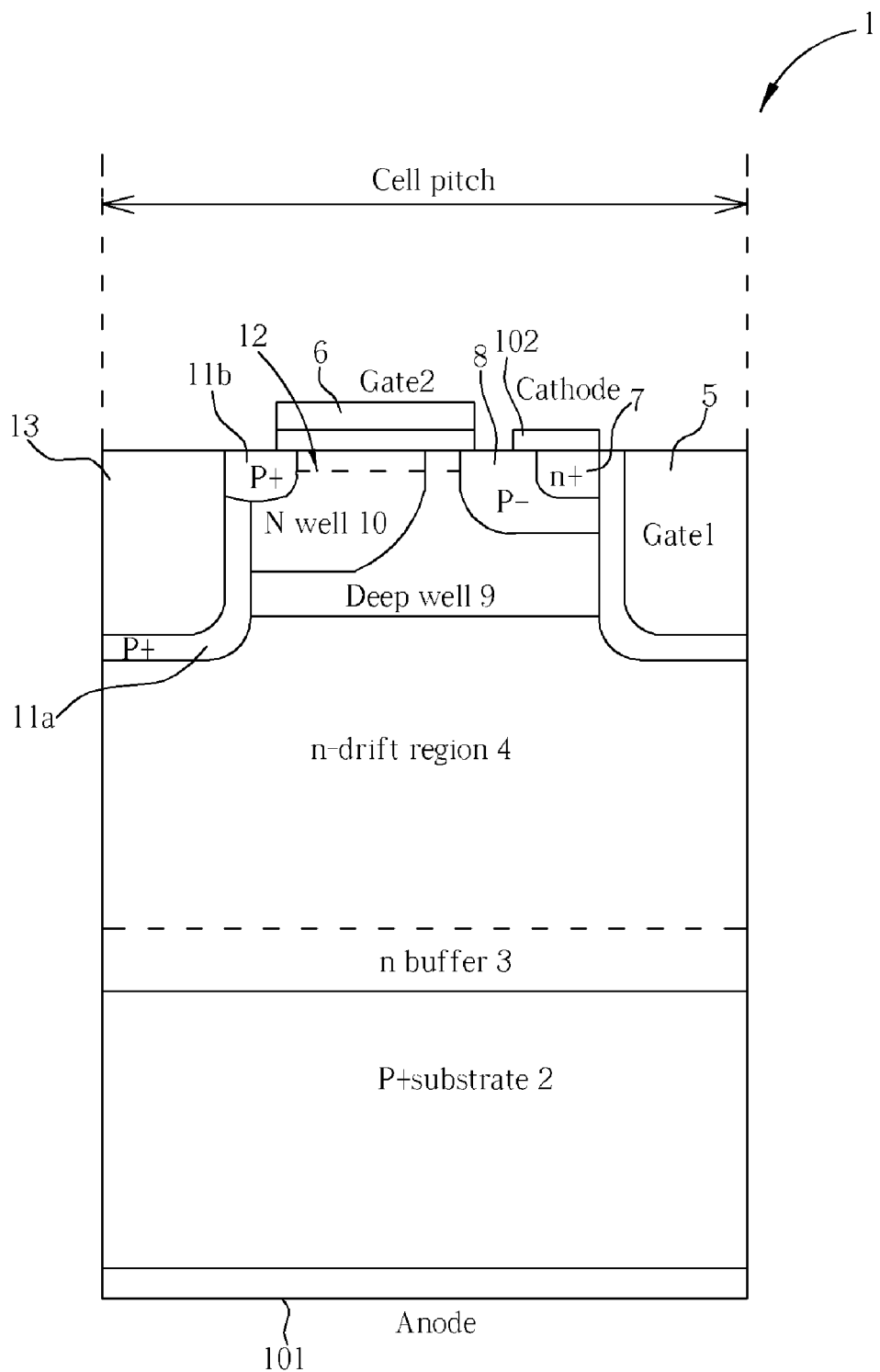
FIG. 9 shows a cross-section of an IGBT device according to another embodiment of the present invention.

Referring to FIG. 9, as compared to the IGBT device 1 shown in FIG. 5, the IGBT device 1 shown in FIG. 9 has an n well 10 that only surrounds the p+ diffusion region 11b, but not the p+ cathode short region 8 and the n+ cathode region 7. In this way, during the off-state, the deep p well 9 is directly clamped to the cathode potential through the p+ cathode short region 8.

Figure 10:
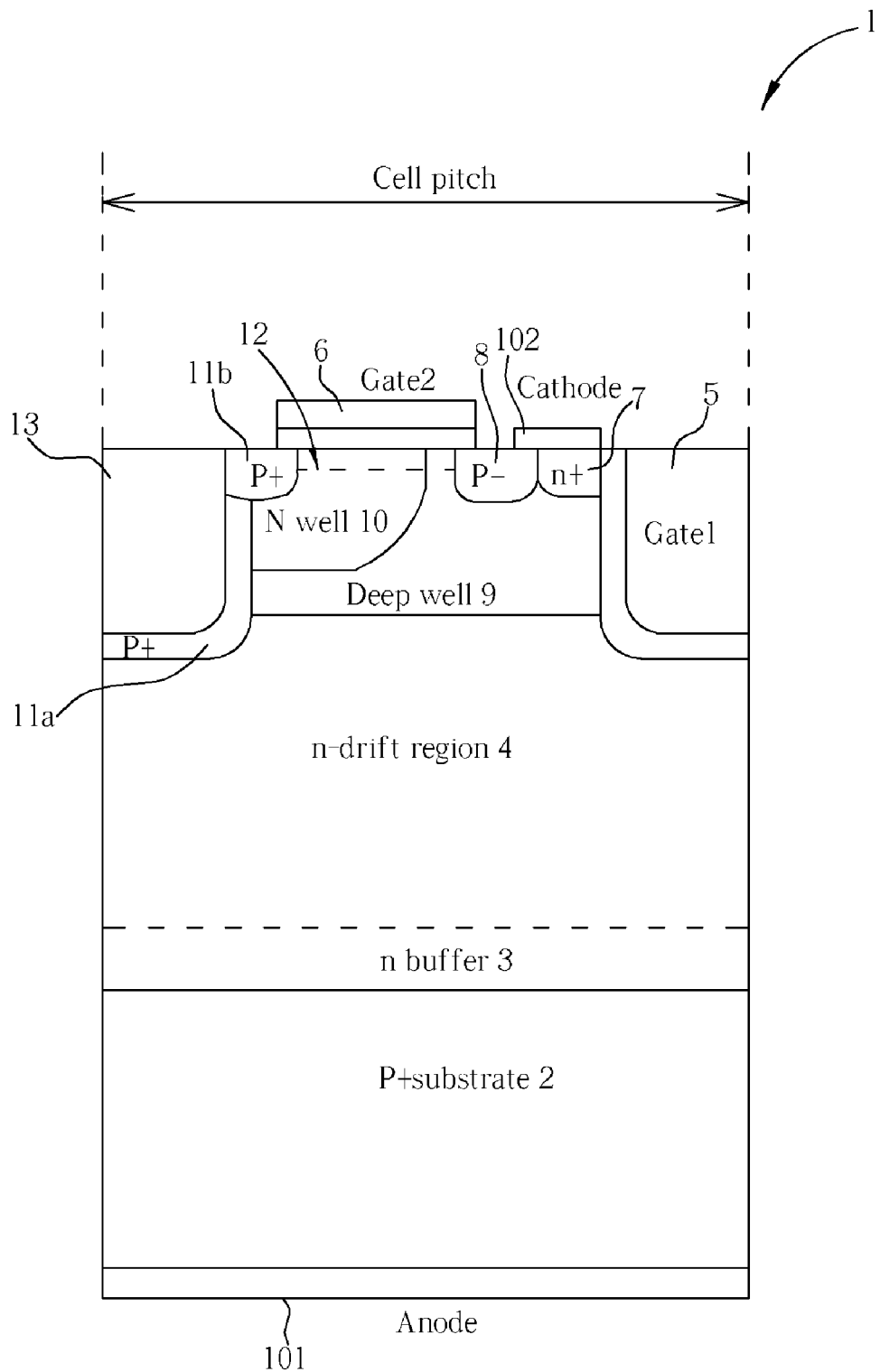
FIG. 10 shows a cross-section of an IGBT device according to a yet another embodiment of the present invention.

Referring to FIG. 10, as compared to the IGBT device 1 shown in FIG. 9, the IGBT device 1 shown in FIG. 10 has the p+ cathode short region 8 adjacent to the n+ cathode region 7, and not surrounding (enclosing) the n+ cathode region 7.

Figure 11:
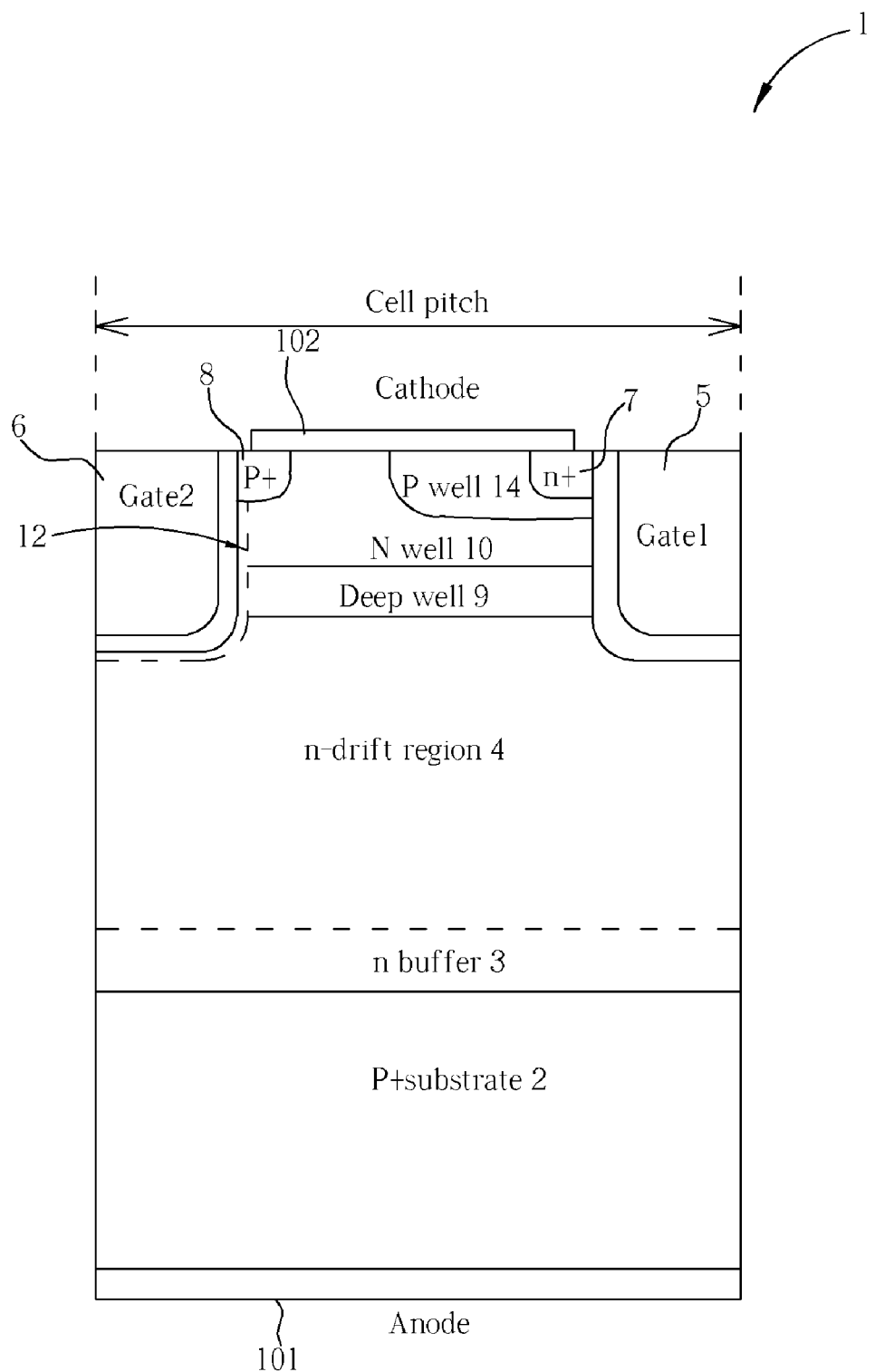
FIG. 11 shows a cross-section of an IGBT device according to a further embodiment of the present invention.

Referring to FIG. 11, as compared to the IGBT device shown in FIG. 6, the IGBT device 1 shown in FIG. 10 has the p well region 14 surrounding (enclosing) only the n+ cathode region 7, but not the p+ cathode short region 8. This may be beneficial in adjusting the threshold voltage of the second, depletion mode p-channel, MOSFET.

Figure 12:
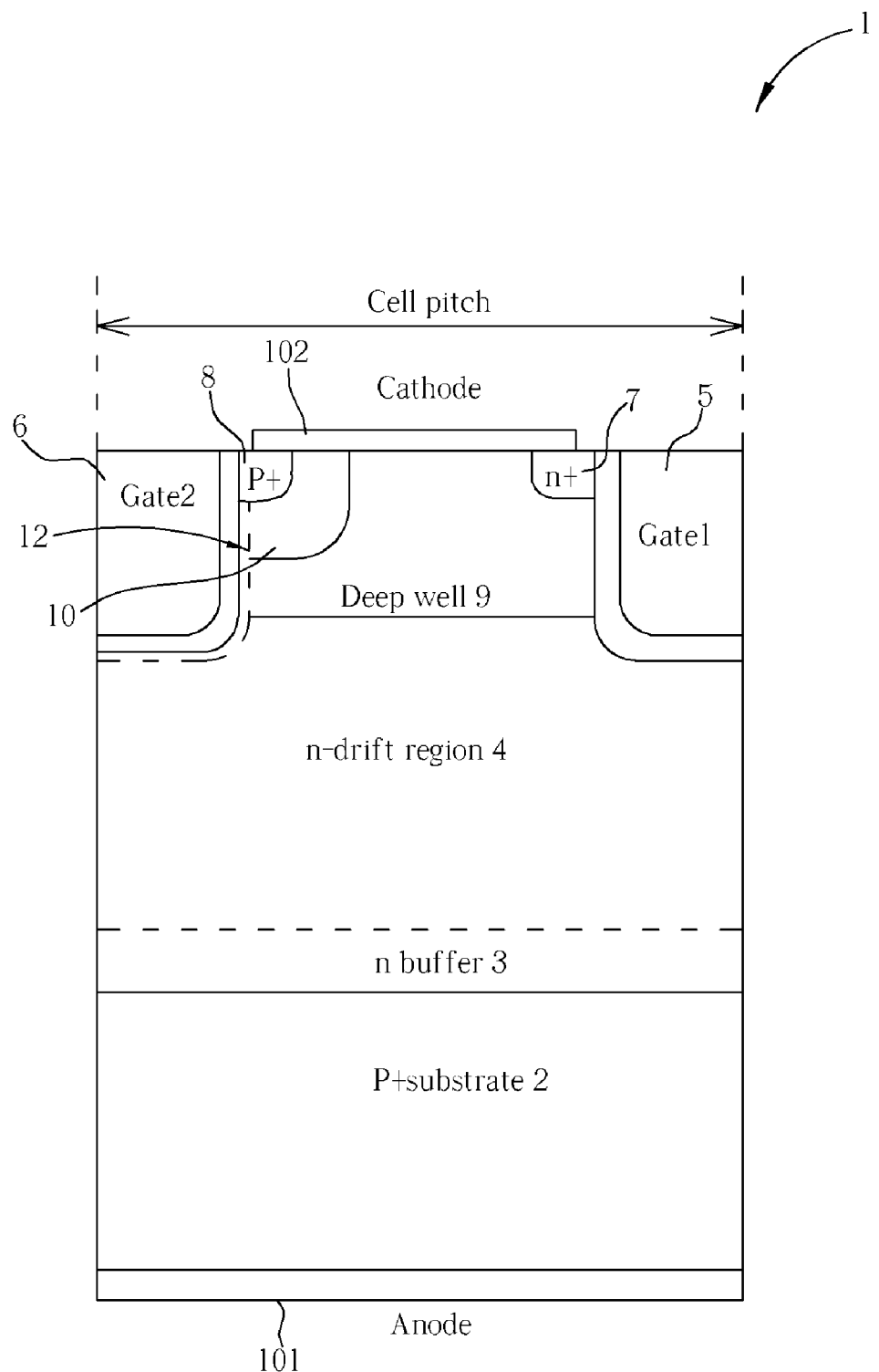
FIG. 12 shows a cross-section of an IGBT device according to a yet further embodiment of the present invention.

Referring to FIG. 12, as compared to the IGBT device shown in FIG. 6, the IGBT device 1 shown in FIG. 10 has a single, deep p well 9. The n well 10 surrounds only the p+ cathode short region 8. This may be simpler to manufacture than the IGBT device 1 shown in FIG. 6. Also the cathode terminal 102 is connected directly to the deep p well 9.

Figure 13:
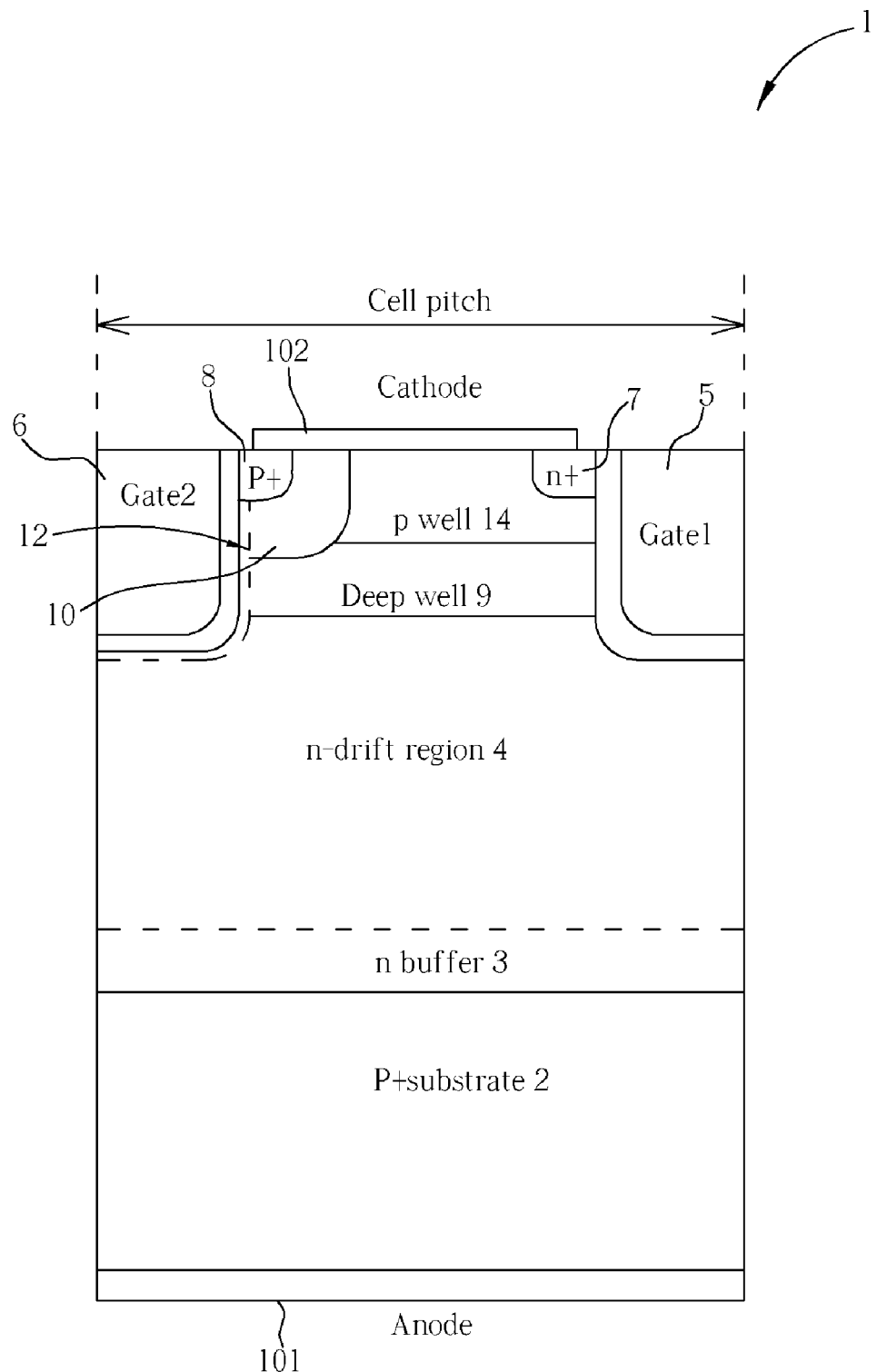
FIG. 13 shows a cross-section of an IGBT device according to a yet further embodiment of the present invention.

Referring to FIG. 13, it is a variation of the IGBT device 1 shown in FIG. 12, where an extra shallower and a p well 14 which is more highly doped is added on top of the deep p well 9.

Figure 14:
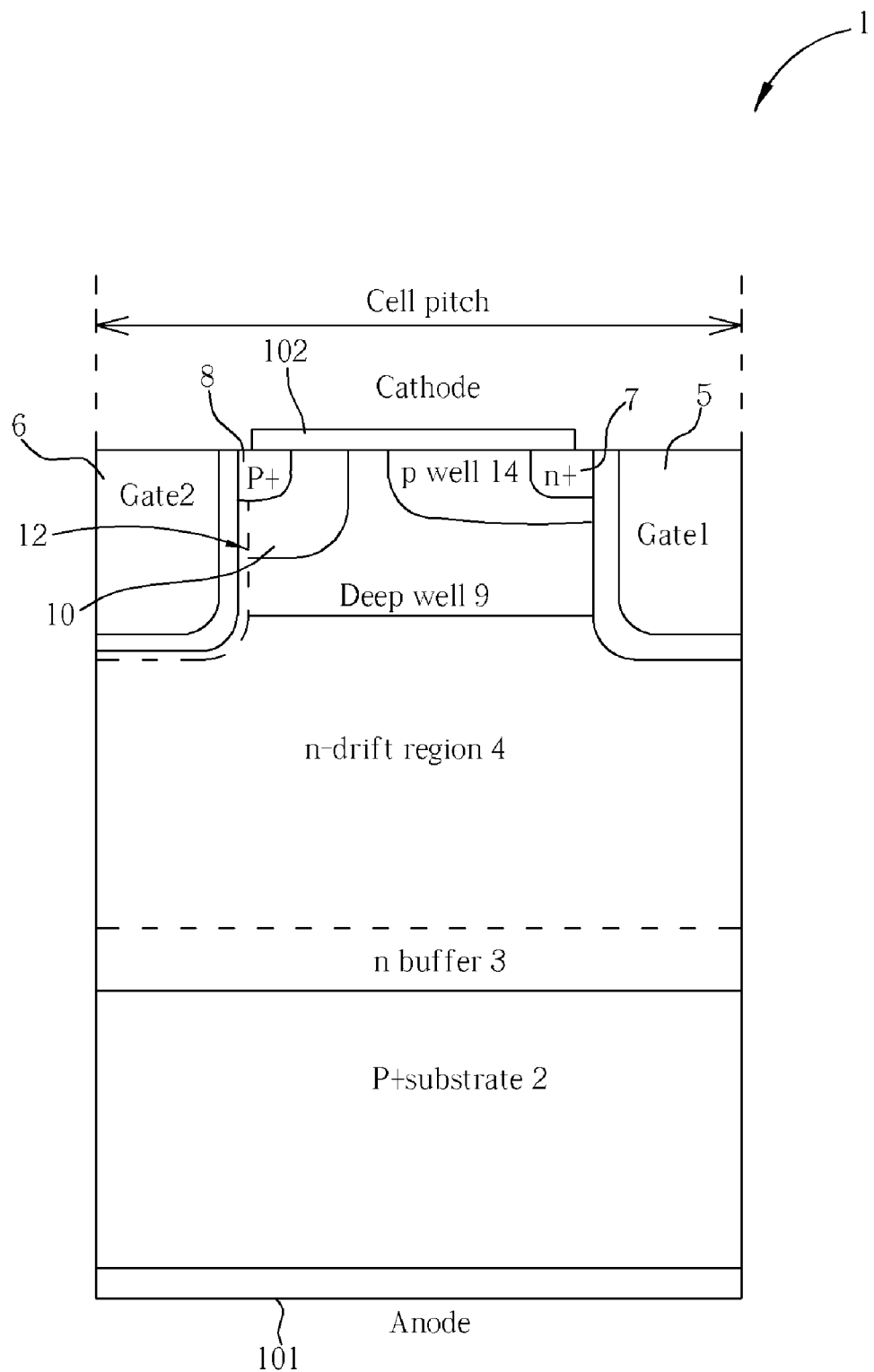
FIG. 14 shows a cross-section of an IGBT device according to a yet further embodiment of the present invention.

Referring to FIG. 14, it is a variation of the IGBT device 1 shown in FIG. 13, where the extra shallower and the more highly doped p well 14 is only enclosing the n+ cathode region 7, but does not make contact nor enclose the n well layer 10.

Figure 15:
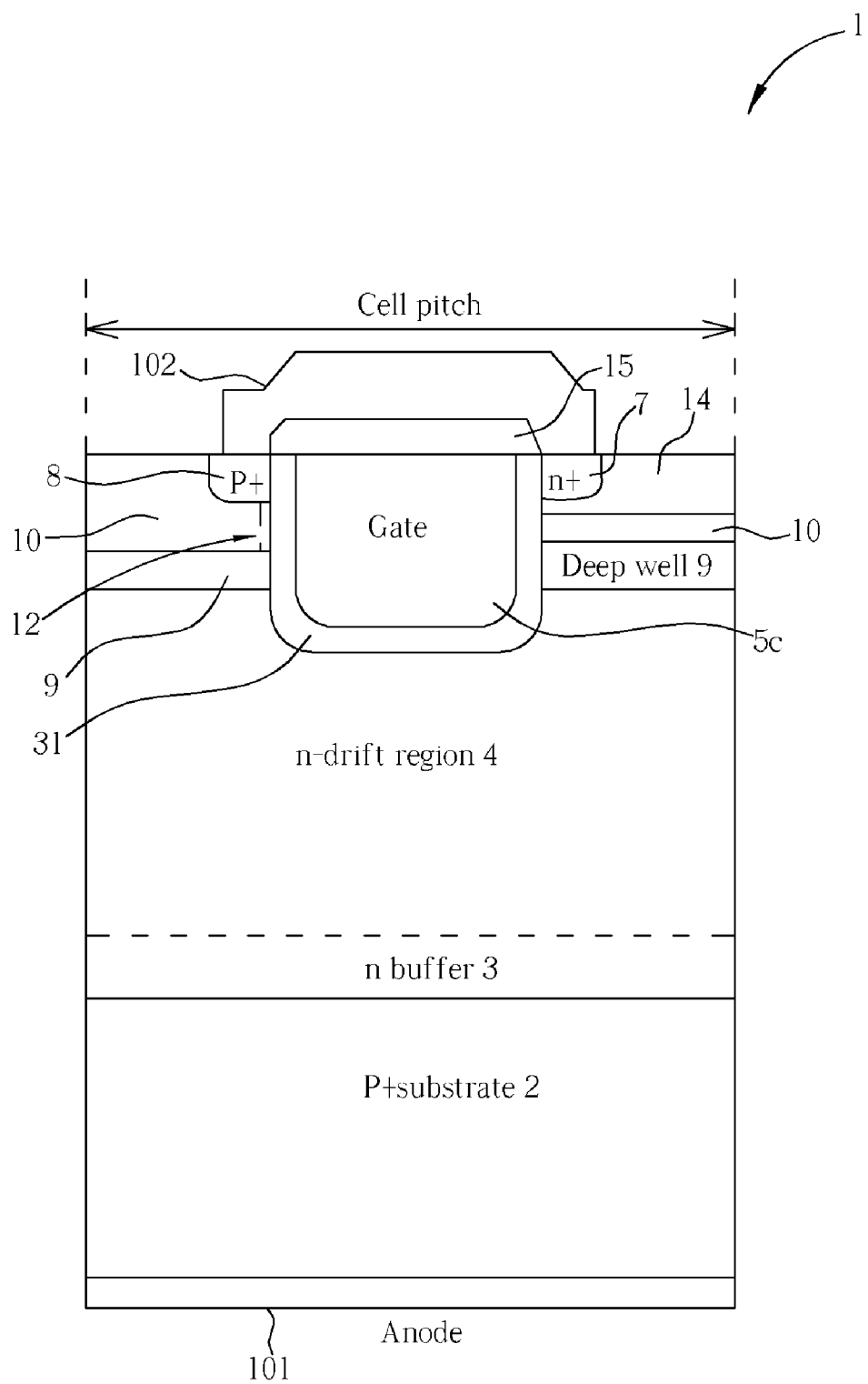
FIG. 15 shows a cross-section of an IGBT device according to a yet further embodiment of the present invention.

Referring to FIG. 15, it is a variation of the IGBT device 1 shown in FIG. 6, where an n-channel and a p-channel 12 are placed on each side of a common trench gate. An insulated gate 5c is the same for both channels, but the channels form in different physical positions. When the gate voltage is greater than 0 V but lesser than the threshold voltage of the pre-formed p-channel 12, the p-channel MOSFET is then ON. This condition occurs during the off-state and during the transient of the IGBT and is beneficial for extracting the holes during the turn-off of the IGBT. When the gate voltage is greater than the threshold voltage of the n– channel (placed at the surface of the p well 14, the n well 10, and the deep p well 9, at the interface with the gate oxide), the IGBT device n-channel MOSFET is on, thereby turning the IGBT ON, while the p– channel is OFF.

Figure 16:
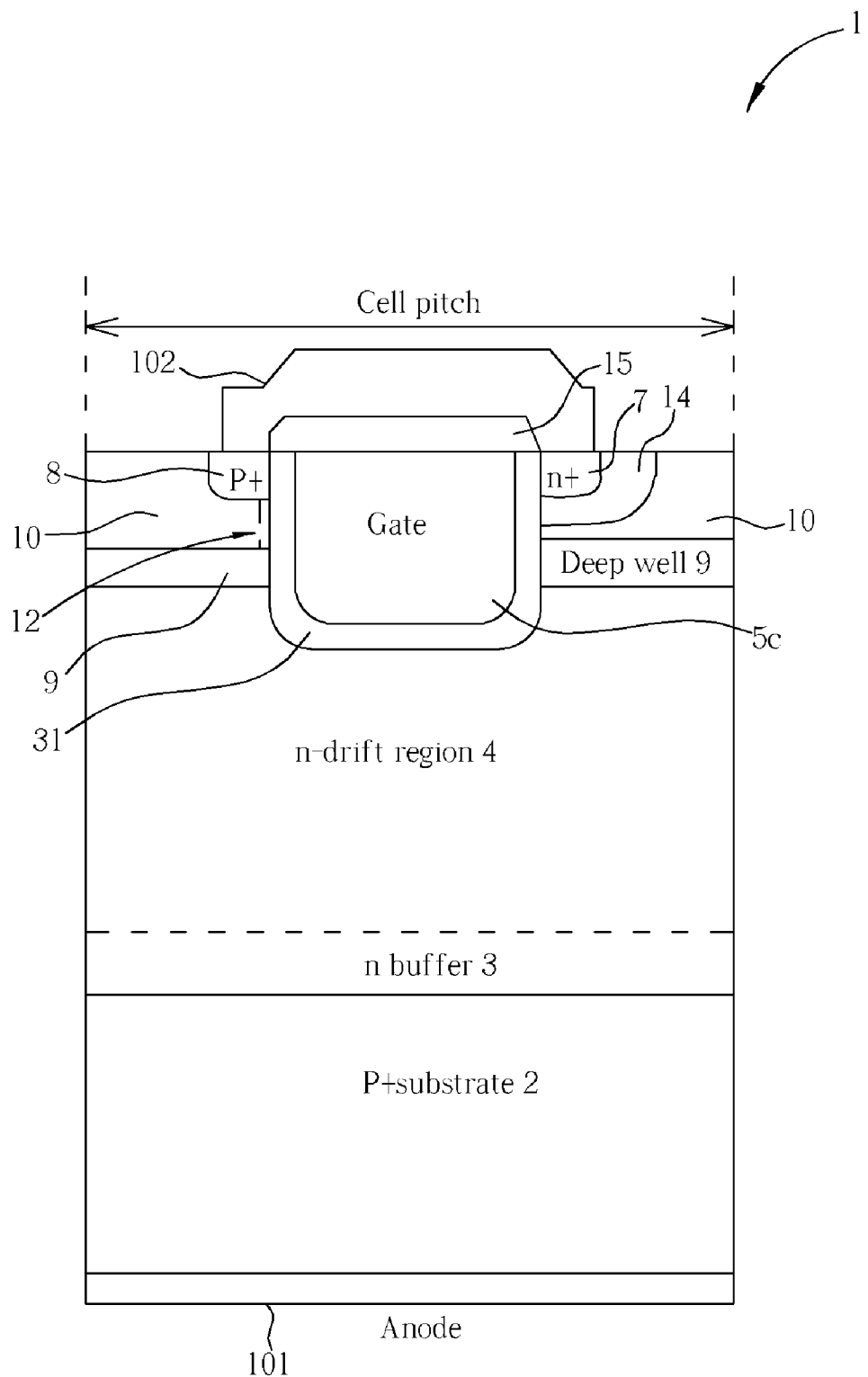
FIG. 16 shows a cross-section of an IGBT device according to a yet further embodiment of the present invention.
Figure 17:
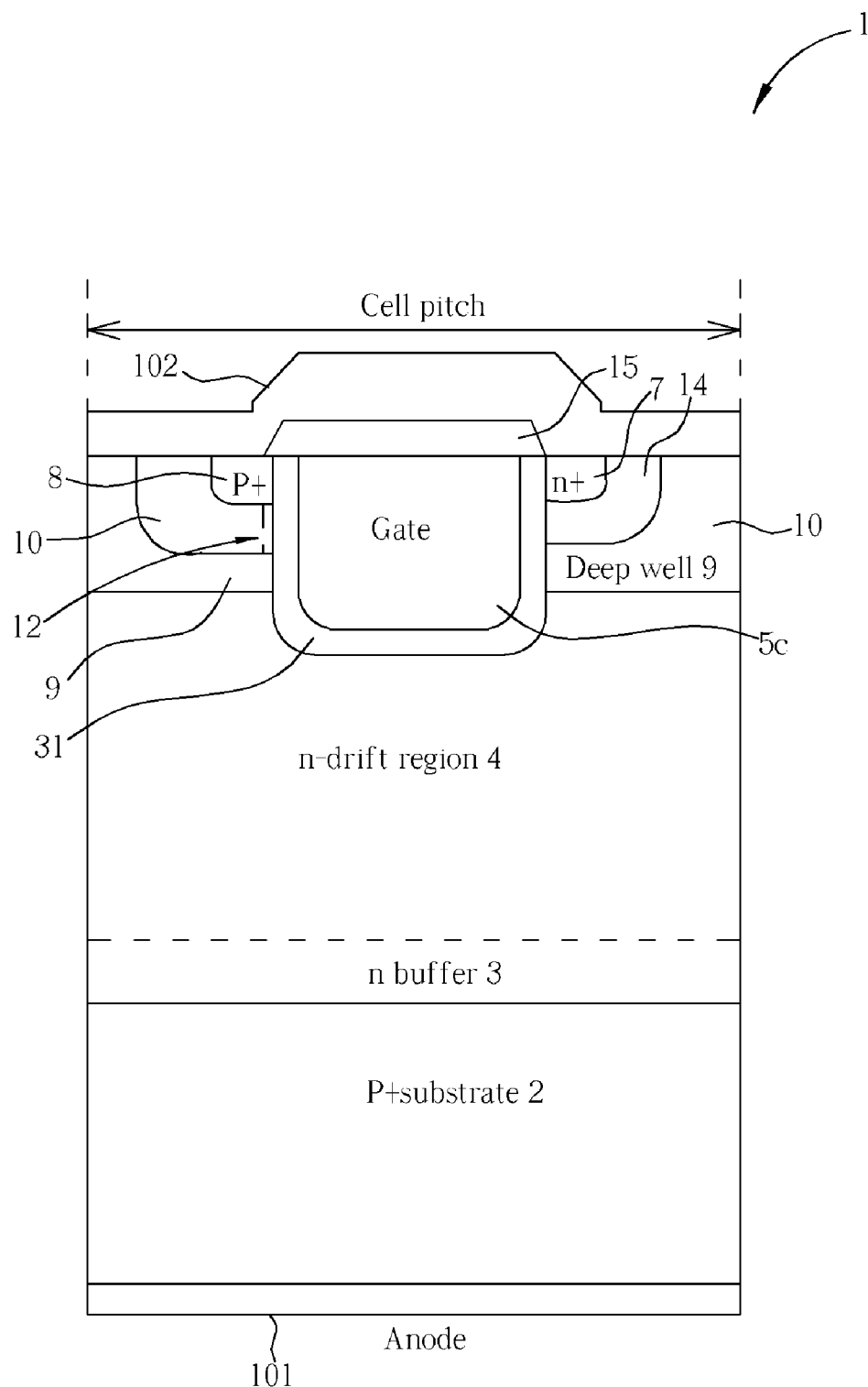
FIG. 17 shows a cross-section of a cell of an IGBT device according to a yet further embodiment of the present invention.

Referring to FIG. 17, it is a variation of the IGBT device shown in FIG. 16, where the p well 14 and the n well 10 have a different shape.

Figure 18:
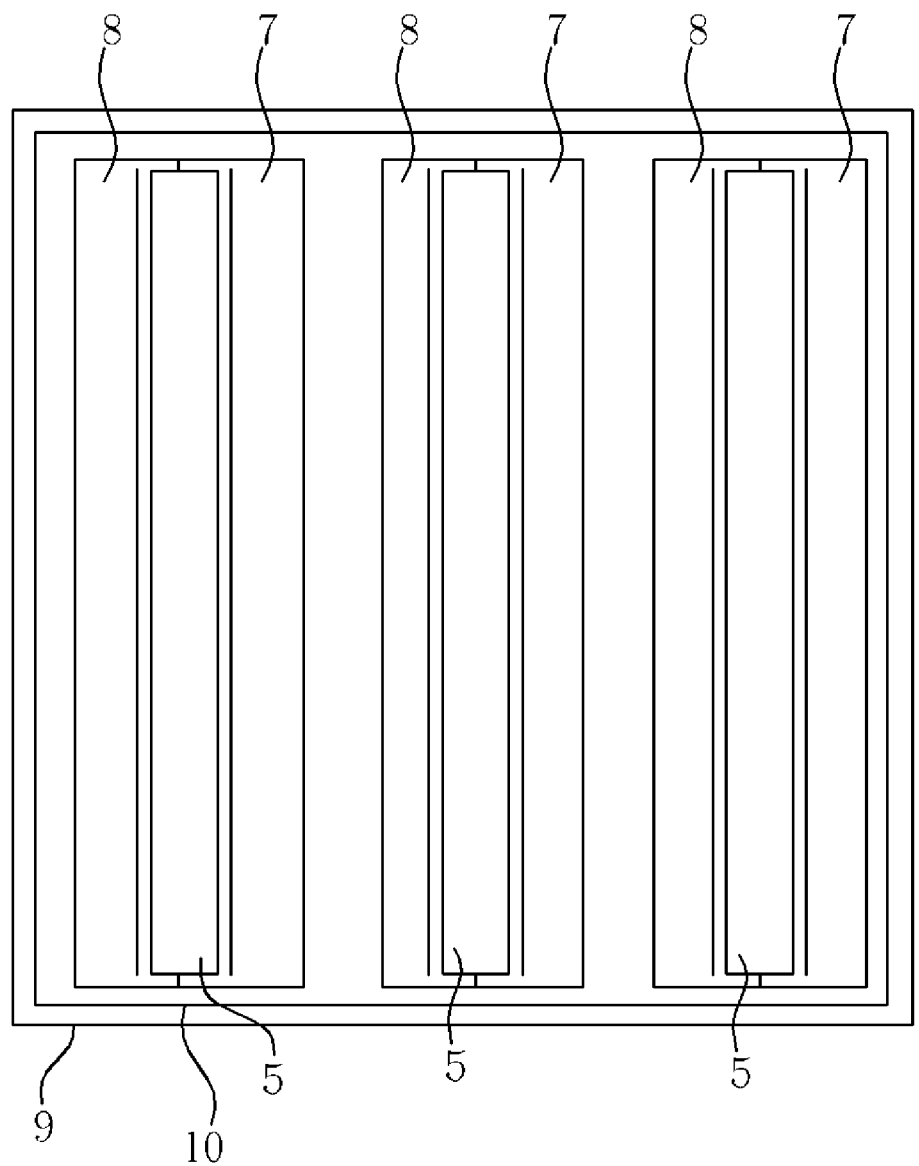
FIG. 18 shows a schematic top view of a power device comprising a plurality of IGBT devices according to the second embodiment of the present invention.

Referring to FIG. 18, a power device is made of several finger cells (3 are shown here). Each finger cell contains several layers, and only a few are shown here for simplicity. The n+ cathode regions 7 which act as the source for the enhancement mode n-channel MOSFET and the p+ cathode short regions 8 which act as the drain for the depletion mode p-channel MOSFET are shown to be placed at either side of each of the insulated gate 5 (comprising a polysilicon layer 32 and the gate oxide 15).

Figure 19:
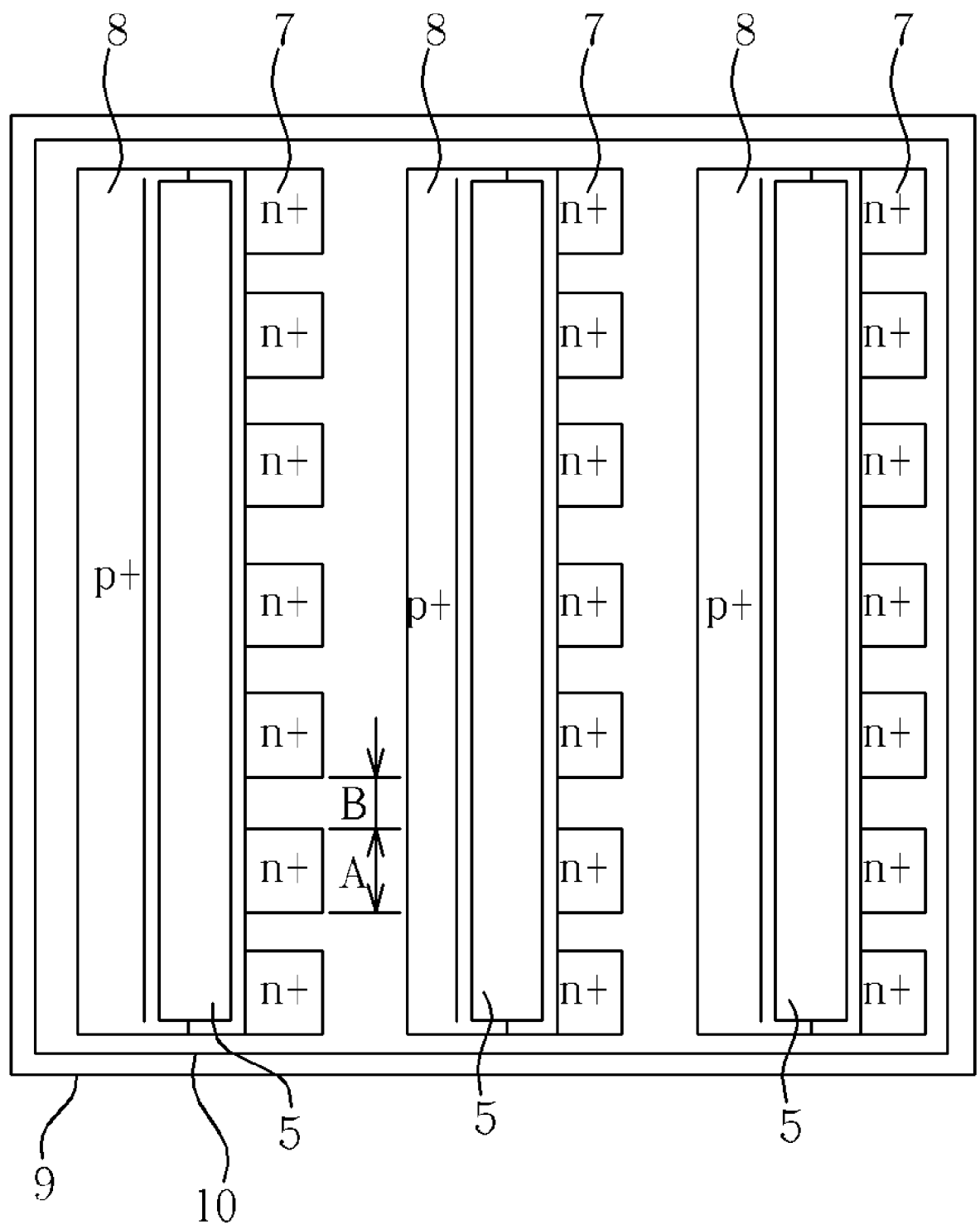
FIG. 19 shows a schematic top view of a power device comprising a plurality of IGBT devices according to a yet further embodiment of the present invention.

Referring to FIG. 19, as compared to FIG. 18, the n+ cathode regions 7 are placed discontinuously around one face of the trench while the p+ cathode short regions 8 are placed continuously around the other side of the trench and the insulated gate 5. The width and the distance between the n+ cells sets a trade-off between a desirably low on-state saturation current and the desirably low on-state voltage drop at the operating current density. The lower the dimension or size for 'A' and the higher the dimension or size for 'B', the lower the saturation current becomes, but the higher the on-state resistance.

Figure 20:
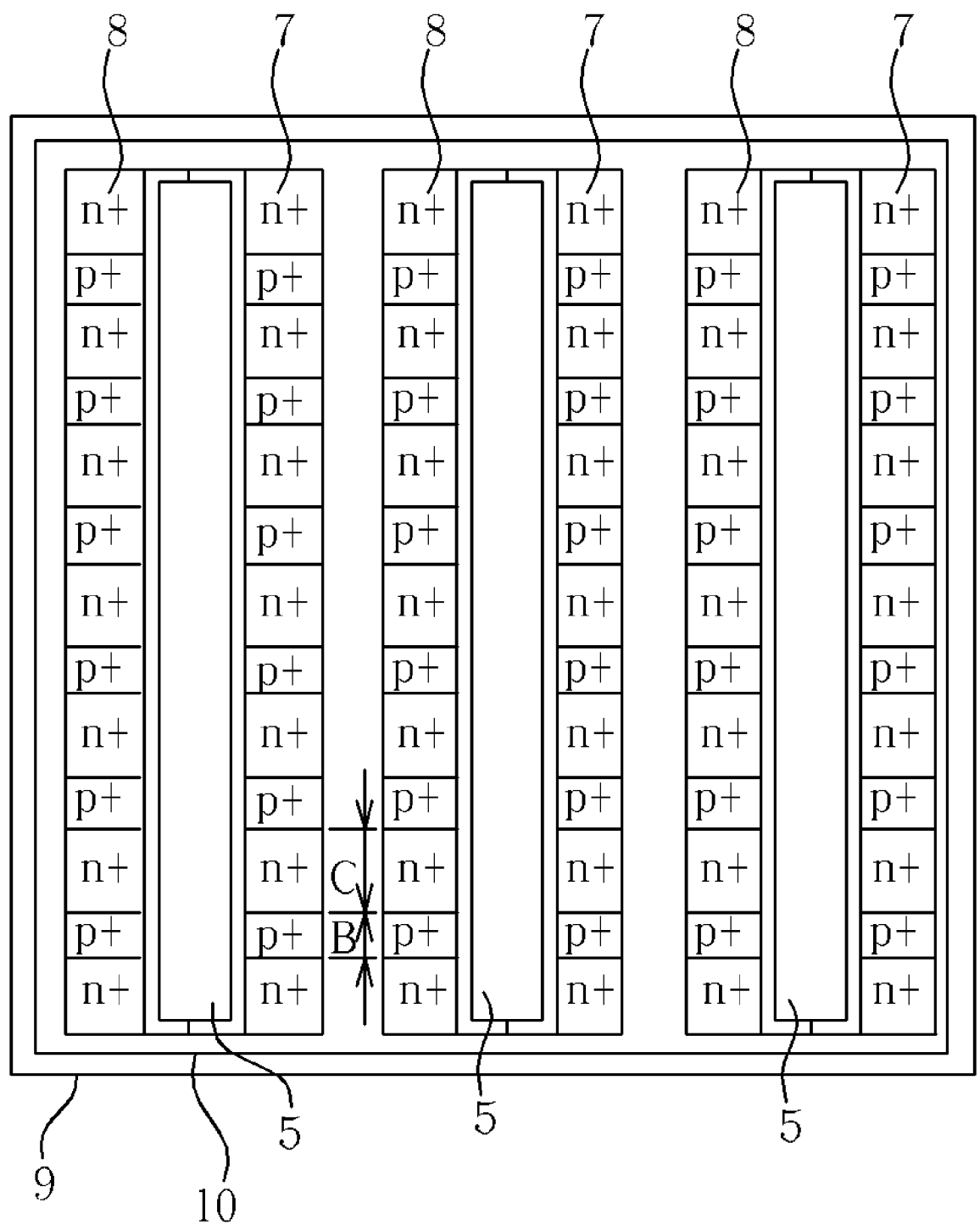
FIG. 20 shows a schematic top view of a power device comprising a plurality of IGBT devices according to a yet further embodiment of the present invention.

Referring to FIG. 20, as compared to FIG. 19, both the n+ cathode regions 7 and the p+ cathode short regions 8 are placed discontinuously side by side around the trenches as occupied by the gate 5. The width of the n+ cathode 7 cells, referred to as 'A', and the width of the p+ cathode short 8 cells, referred to as 'B', sets a trade-off between a desirably low on-state saturation current and desirably low on-state voltage drop at the operating current density, a desirably fast turn-off and desirably large safe operating area. The lower the dimension or size for 'A' and the higher the dimension or size for 'B', the lower the saturation current, the faster the turn-off, the higher the safe operating area but the higher the on-state voltage drop at a given current density.

Referring to FIGS. 21a-21g, a method for manufacturing the IGBT devices as shown in FIGS. 15-17 according to a yet another embodiment of the present invention is proposed.

Figure 21A:
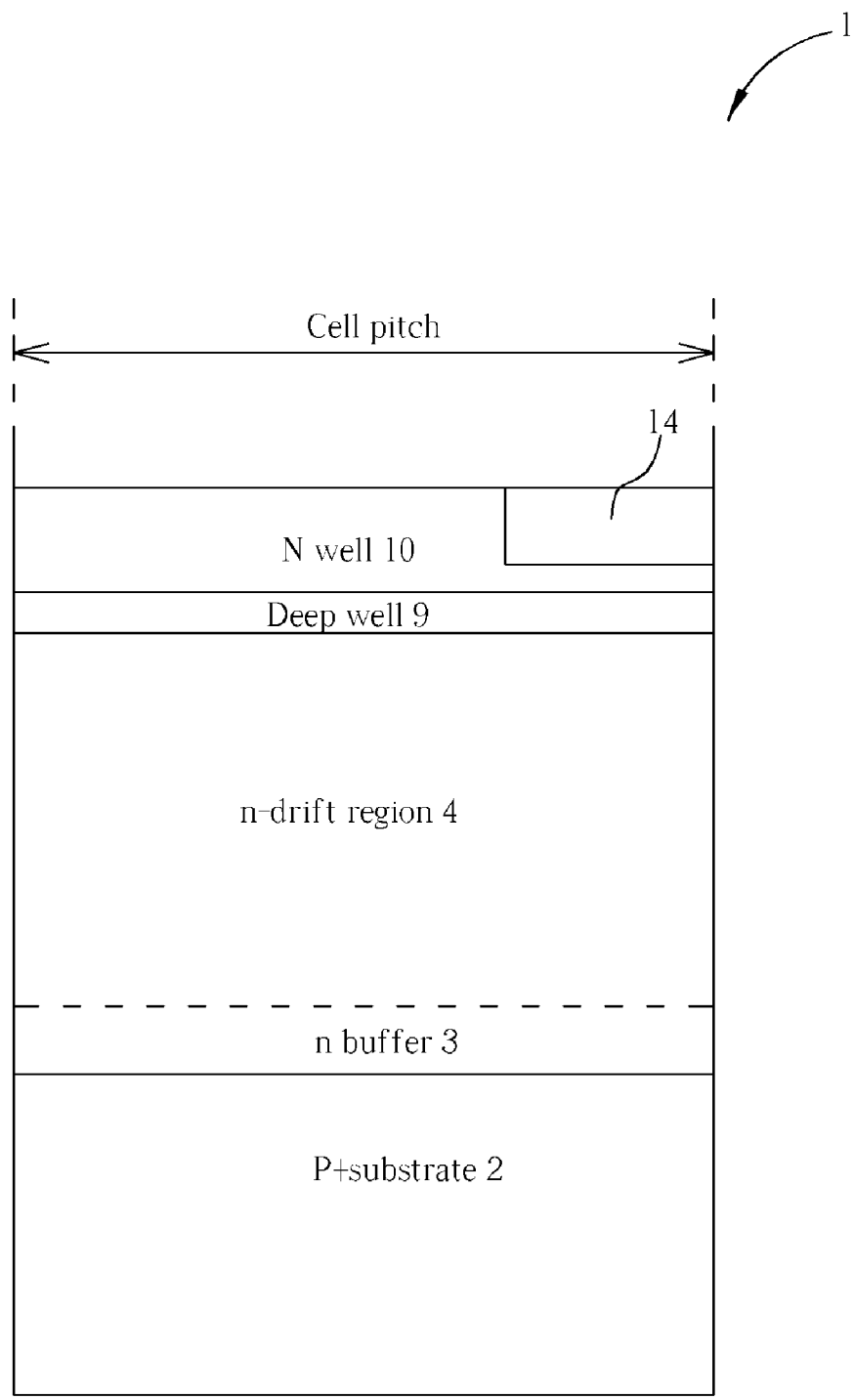
FIGS. 21a-21g shows a method for manufacturing the IGBT devices as shown in FIGS. 15-17 according to a yet another embodiment of the present invention.

Referring to FIG. 21a, a p+ substrate layer 2 is provided by having a highly doped p-type region formed on the back surface of a semiconductor substrate. p-type impurities such as boron (B) at high concentrations are introduced to the back surface of the semiconductor substrate to form the p+ substrate layer 2. Furthermore, an n buffer layer 3, a n– drift region 4, a deep p well layer 9, an n well layer 10 are sequentially formed by diffusion or epitaxial growth on a front surface (opposite to the back surface described above) of the p+ substrate layer 2 of the IGBT device 1 as described above. Later, a p well layer 14 is then selectively formed on a portion of the n well layer 10 by using diffusion or epitaxial growth and a photomask.

Figure 21B:
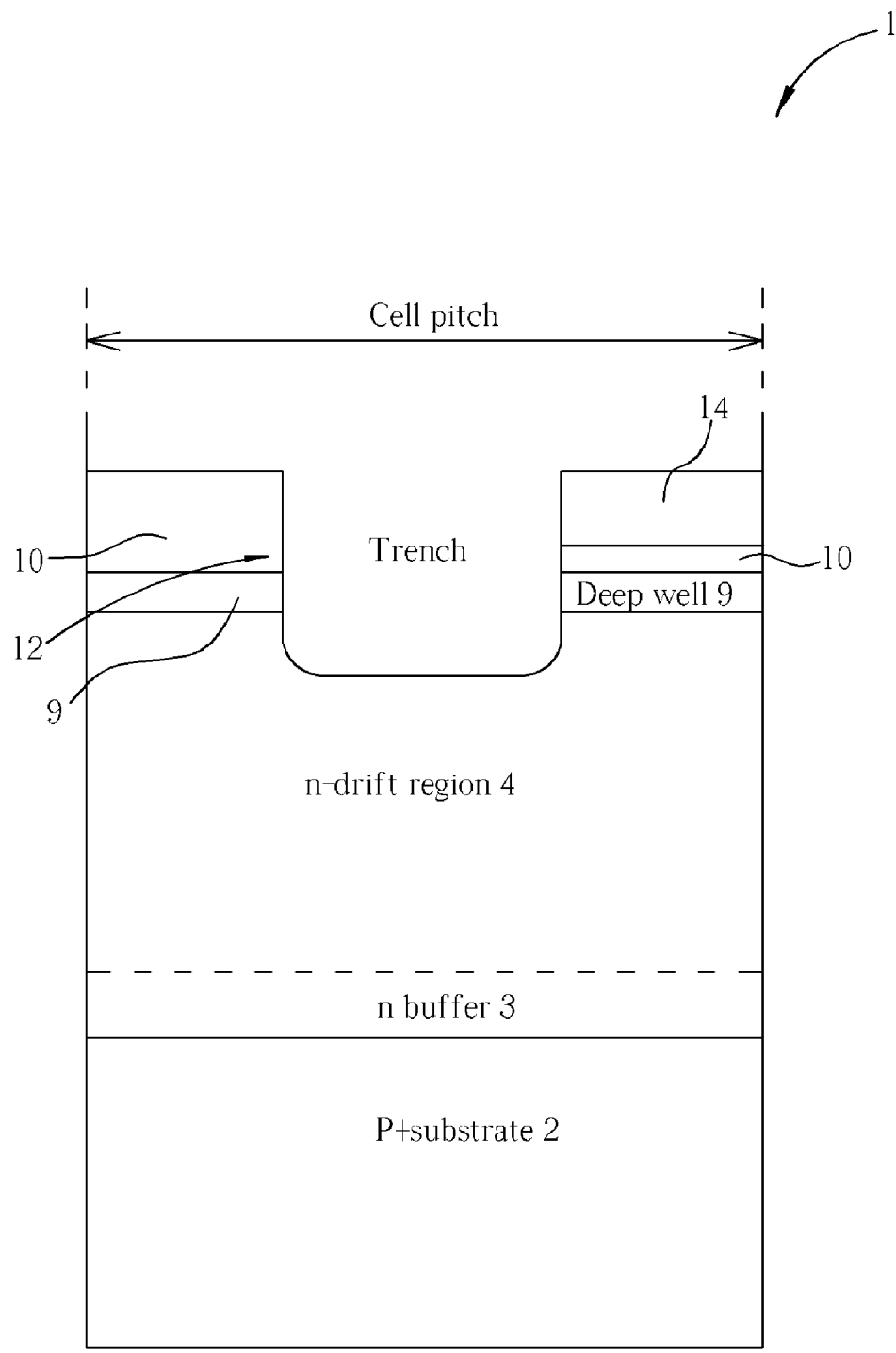

Referring to FIG. 21b, a trench is then formed via anisotropic etching. Using, for example, a mask layer such as an oxide/nitride film pattern (not shown), specifically the trench can be selectively formed as shown in FIG. 21b by means of reactive ion etching (RIE). The trench is to extend through the front surface, the p well layer 14, the n well layer 10, the deep p well layer 9, and reaching the n– drift region 4 as shown in FIG. 21b.

Figure 21C:
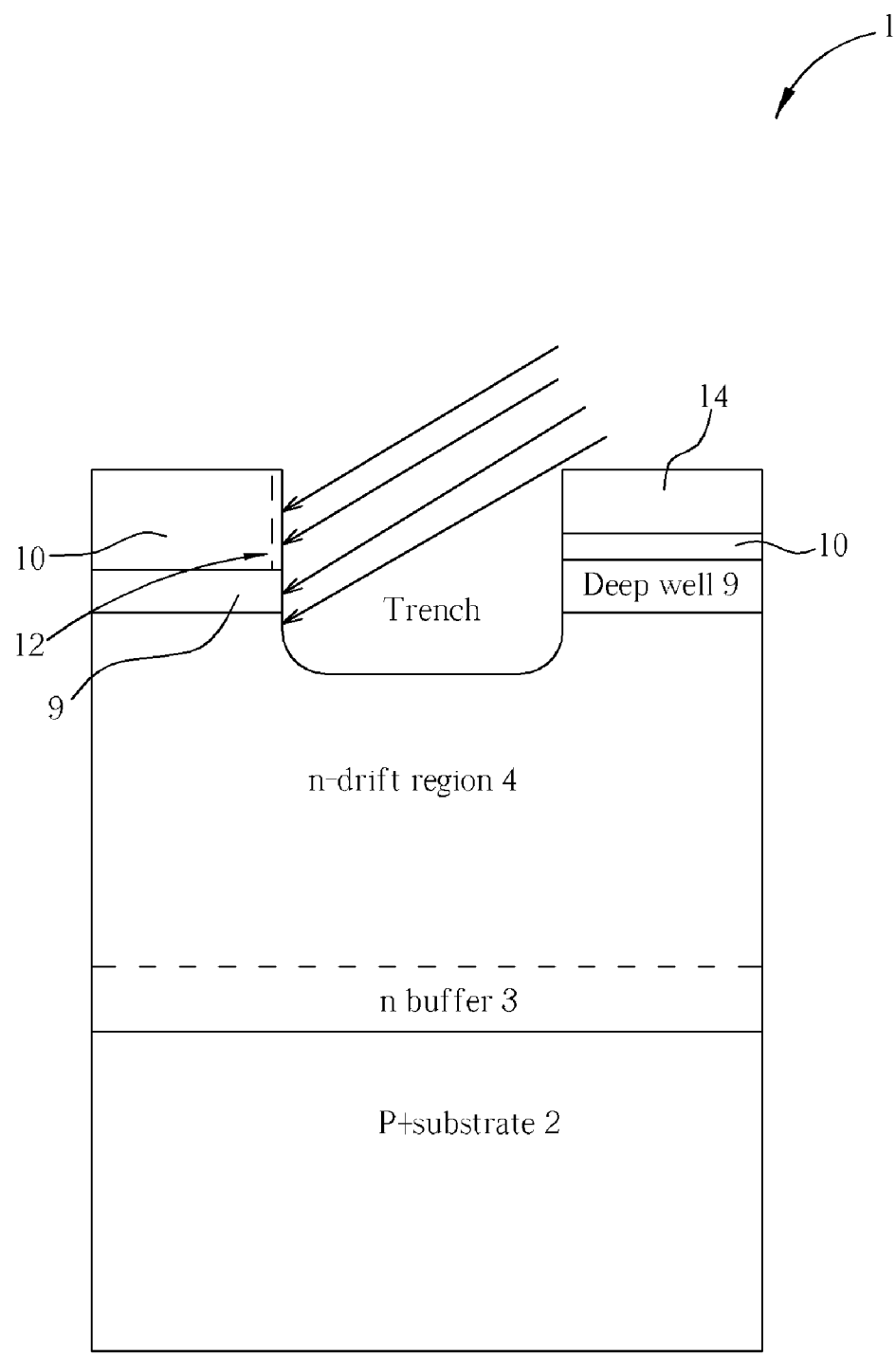

Referring to FIG. 21c, a pre-formed hole channel 12 (p-channel), which is in the form of a diffused pre-formed/buried hole channel comprising of a p-diffusion layer, is selectively formed inside the trench by means of an angle implantation of a plurality of p-type impurities through the trench before being filled, as indicated by the arrowed lines in FIG. 21c. Without preferably using a mask by using an angle implantation, the pre-formed p-channel 12 is ended up on the preferred side of the trench without affecting the n-channel characteristics.

Figure 21D:
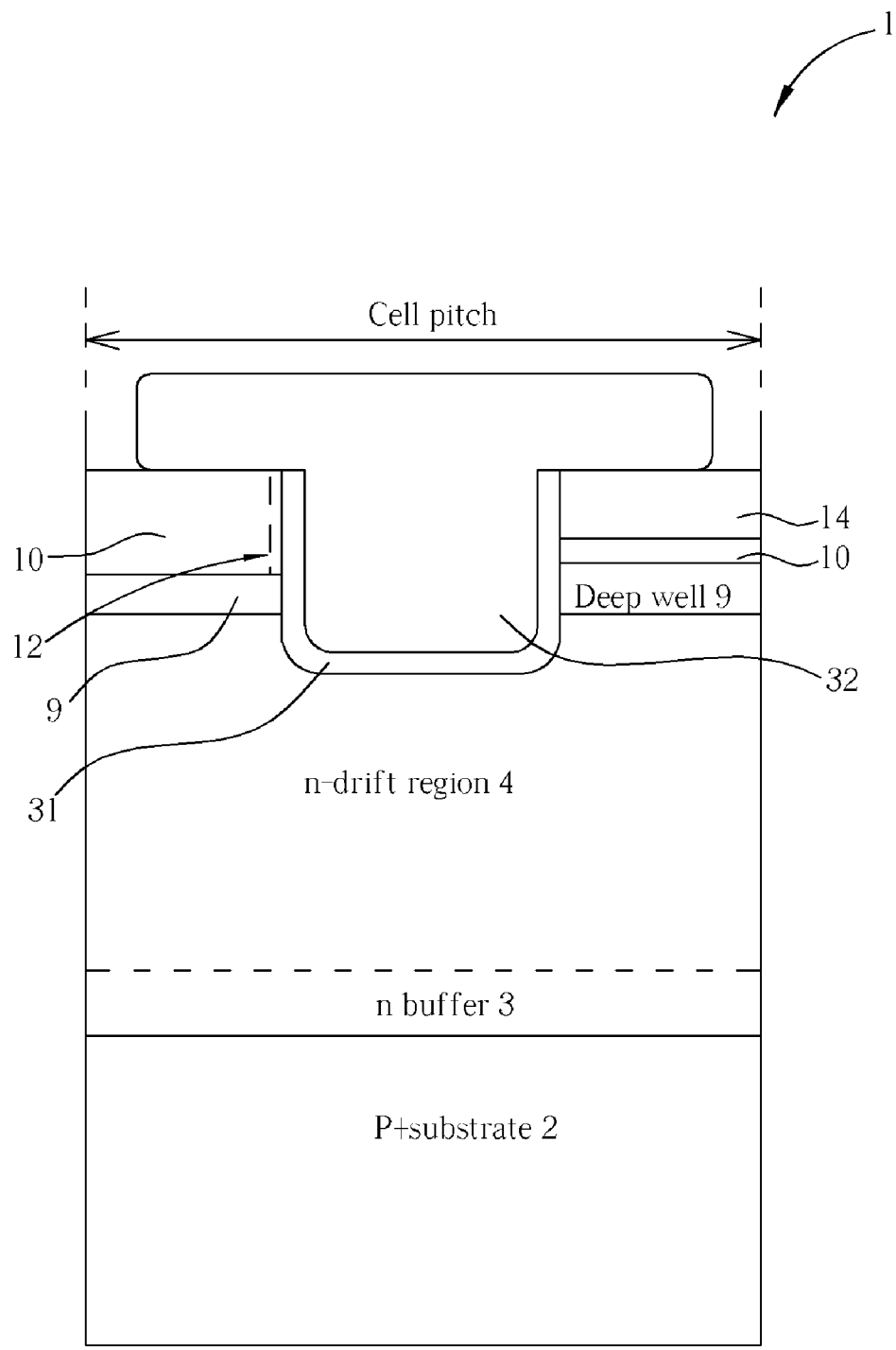
Figure 21E:
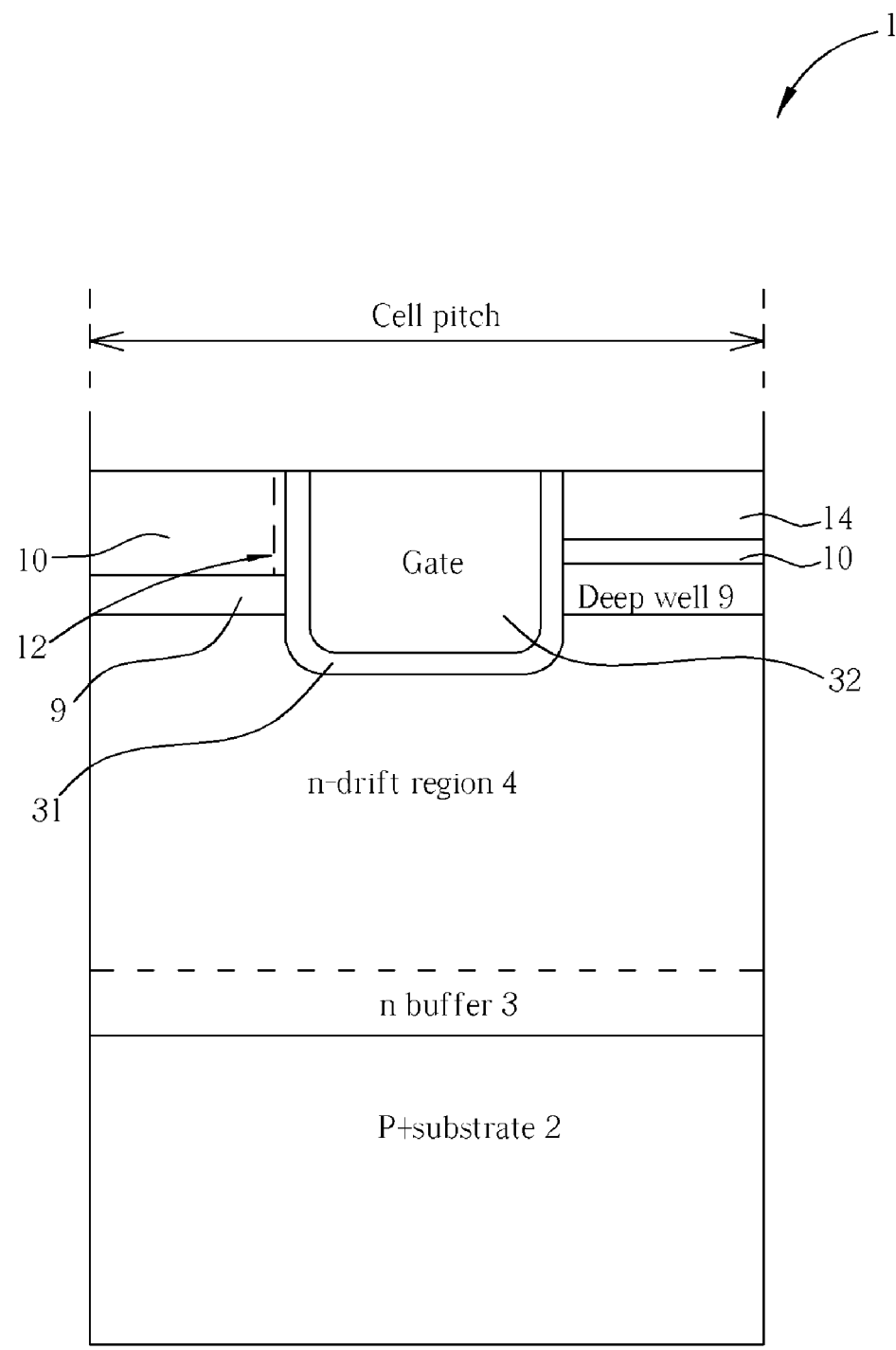

Referring to FIG. 21d, the surface of the pre-formed hole channel 12 is then covered (by oxidation or deposition) by an oxide film, which is referred to as a gate insulating film 31. Using a photolithography step, a polycrystalline silicon film 32 is formed inside the trench as shown in FIG. 21d and etched back as shown in FIG. 21e.

Figure 21F:
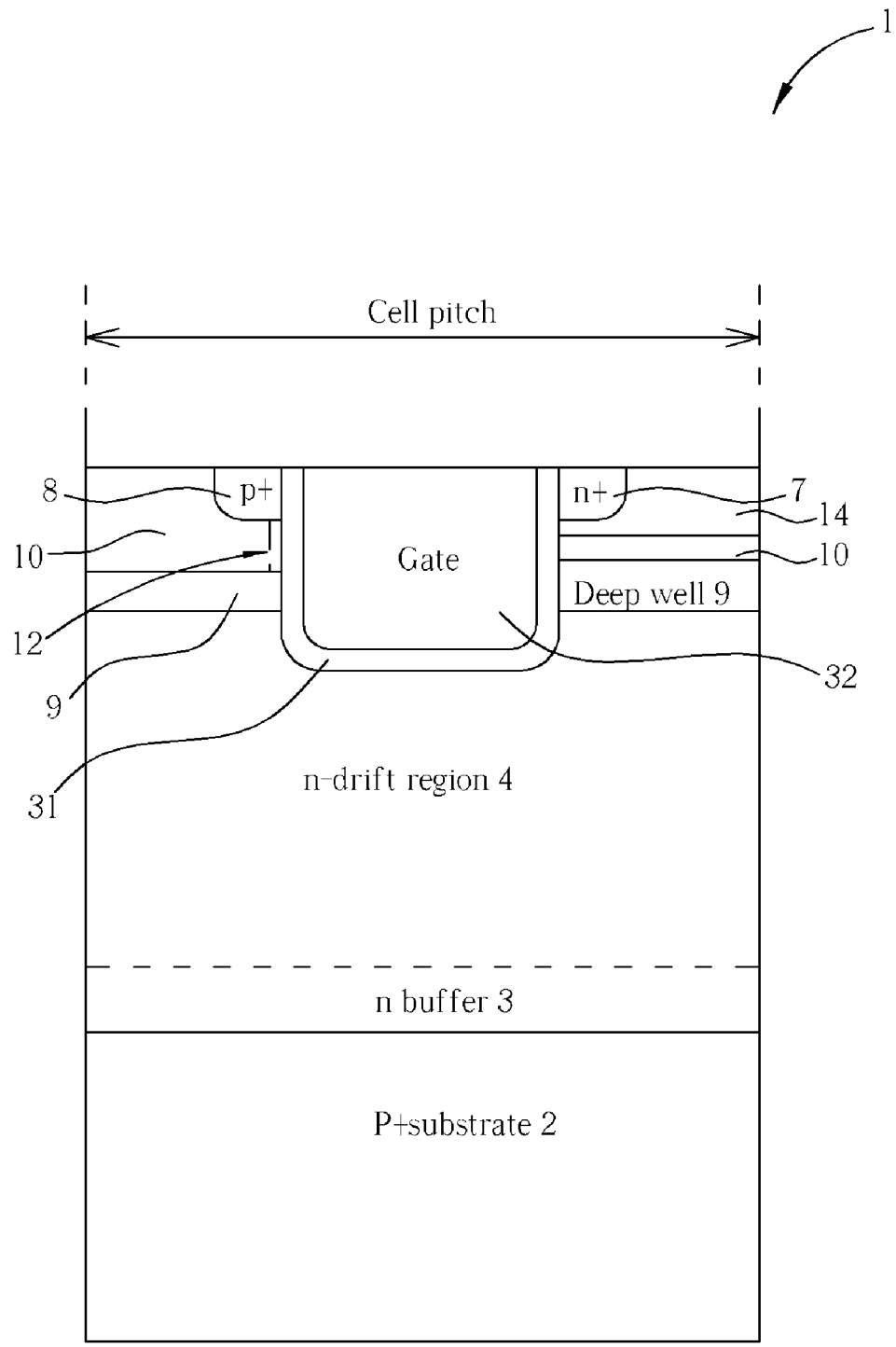

Referring to FIG. 21f, through the use of masking and diffusion or ion implantation, and followed by thermal treatment, a n+ cathode region 7 and a p+ cathode short region 8 are then successively formed. During the n+ diffusion or ion implantation process, phosphorus or arsenic ions can be implanted. Meanwhile, during the p+ diffusion or ion implantation process, boron ions can be implanted. Later, the implants are driven in. The drive in may be done after all implants have been performed, or it may be done in stages.

Figure 21G:
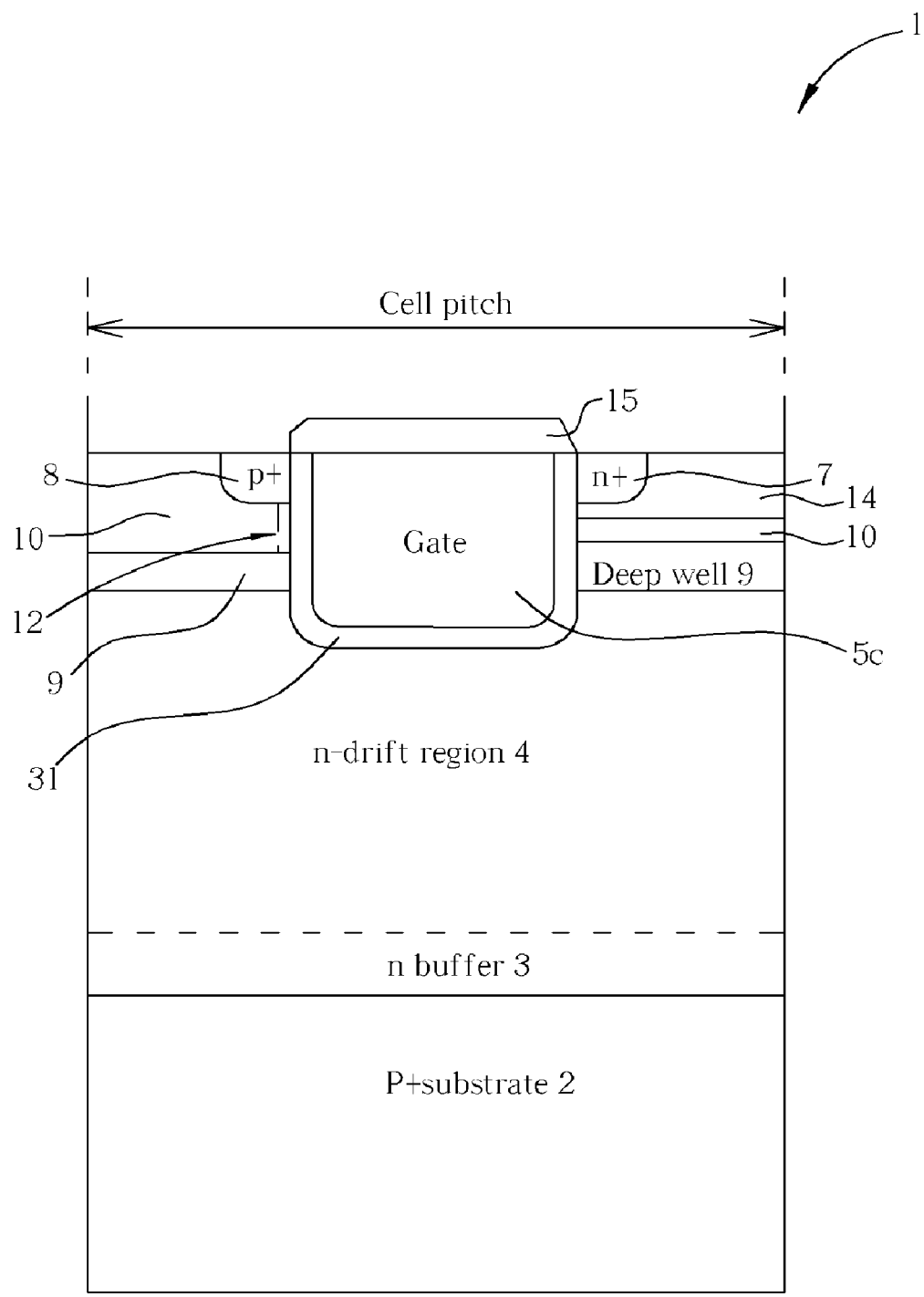

Referring to FIG. 21g, an insulating oxide film 15 is then selectively formed to cover and electrically isolate the gate electrodes of the gate 5c. The insulating oxide film 15 is formed on the front surface of the semiconductor substrate; and a contact hole (not shown) is made in part of the insulating oxide film 15. Referring then to FIG. 15, the emitter/cathode 102 is then selectively formed on the front surface of the IGBT device 1 and is to be in contact with the p+ cathode short region 8 and the n+ cathode region 7. Finally, a metal electrode in the form of a collector or anode terminal 101 is formed on the back surface of the p+ substrate layer 2 as shown in FIG. 15.

Figure 1:
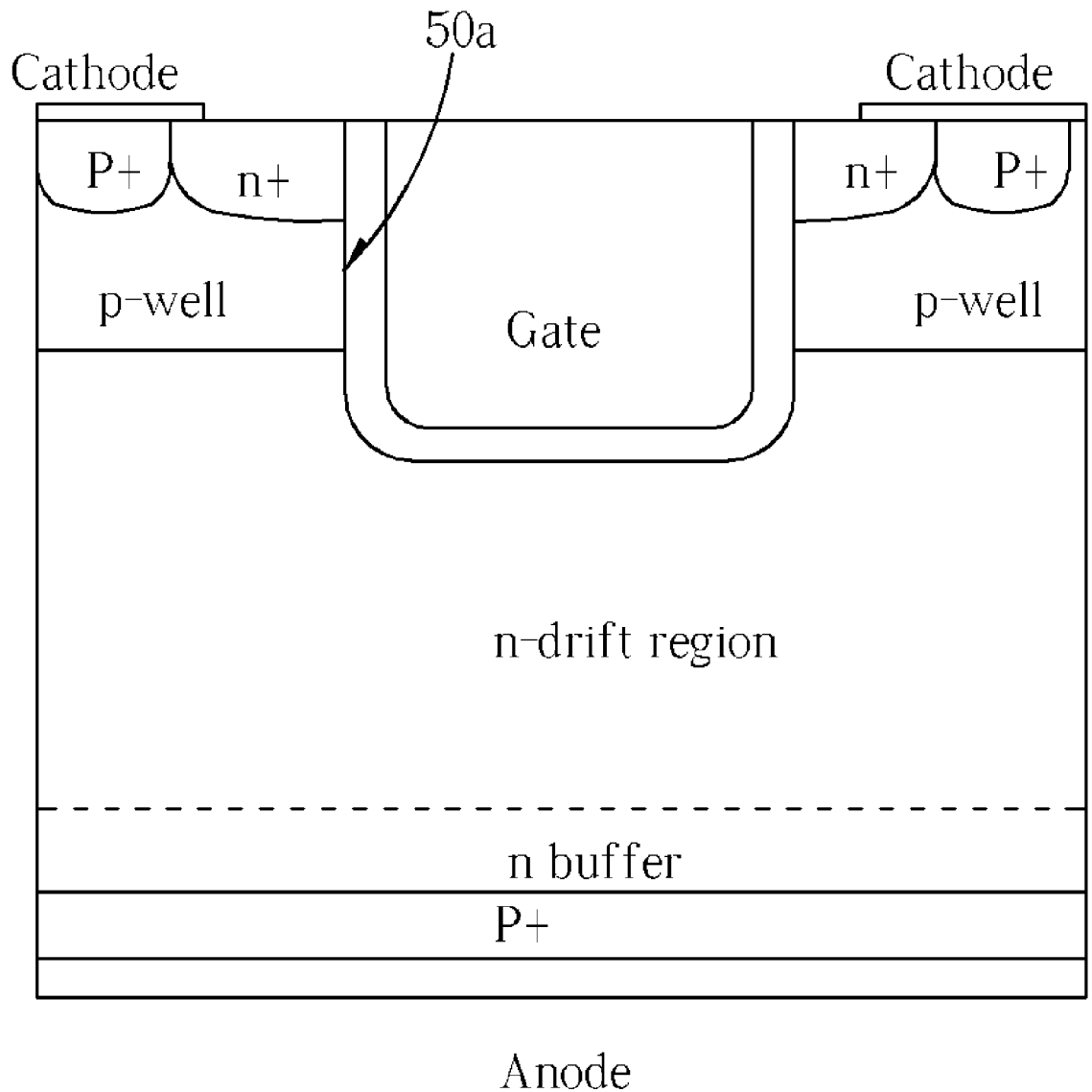
FIG. 1 is a cross-section of a cell of a conventional Trench IGBT.
Figure 2:
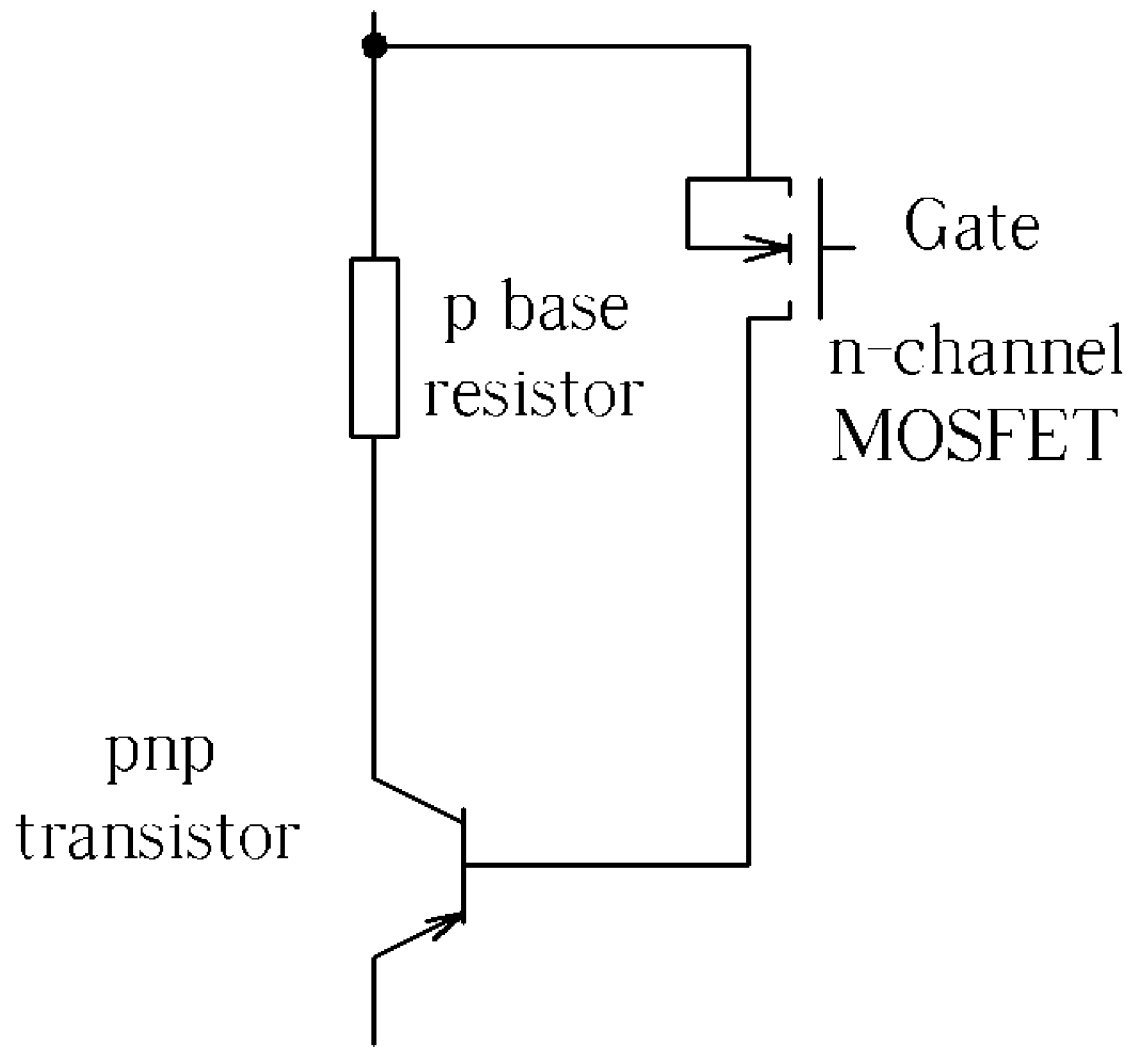
FIG. 2 is a basic equivalent circuit model of the conventional Trench IGBT shown in FIG. 1 depicting the pnp transistor whose base is connected to the MOSFET structure.
Figure 3:
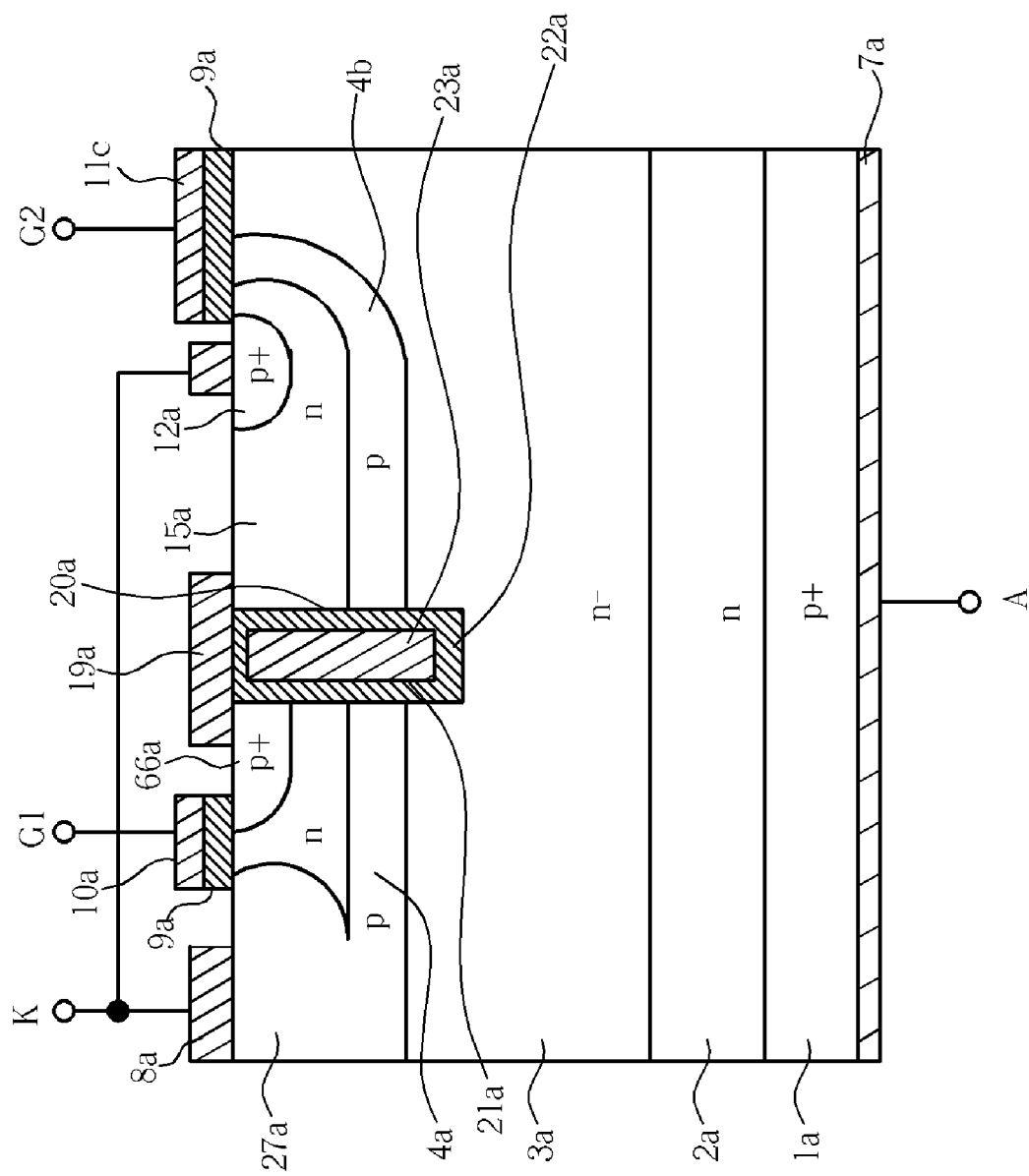
FIG. 3 is a conventional double gate IGBT.
Figure 4:
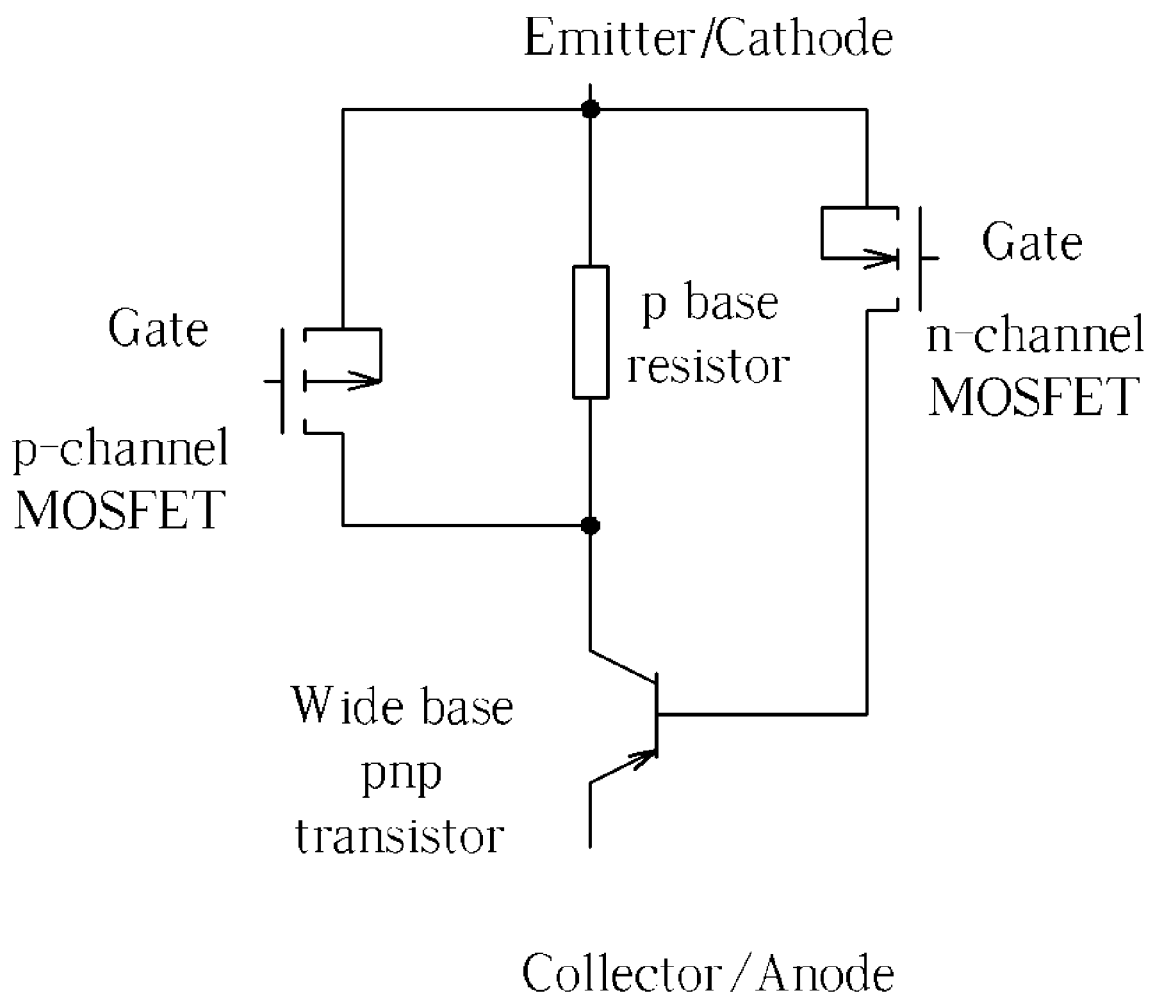
FIG. 4 is a basic equivalent circuit model of the conventional Trench IGBT shown in FIG. 1 when both positive negative voltages are applied to the gate.
Figure 22:
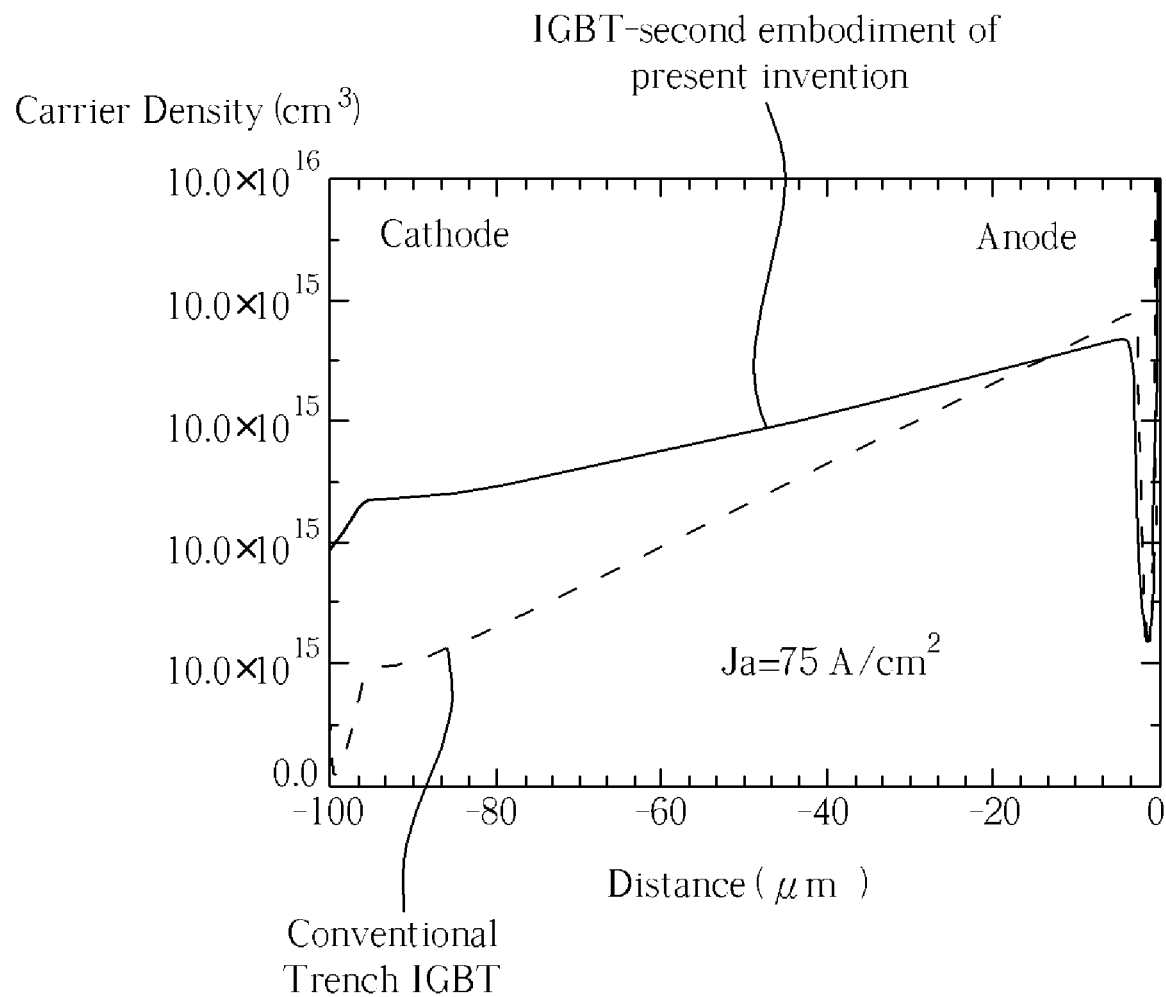
FIG. 22 shows a graph for showing the excess hole concentration (plasma) during the on-state for (i) a conventional (state-of-the-art) trench IGBT, as shown in FIG. 1, and (ii) an IGBT device according to the second embodiment of the present invention as shown in FIG. 6.

Referring to FIG. 22, a graph obtained from finite element simulations for the excess hole concentration (plasma) during the on-state at 75 A/cm2 for two different 1.2 kV devices (i) a conventional (state-of-the-art) trench IGBT, as for example shown in FIG. 1, and (ii) an IGBT device according to the second embodiment of the present invention as shown in FIG. 6. The IGBT device according to the second embodiment of the present invention displays an increased carrier concentration at the cathode side of the n− drift region 4 due to the additional injection of electrons into this drift region 4. By blocking the hole collection with the use of the first bipolar pnp transistor 30a (as shown in the equivalent circuit model of FIG. 8), the electron injection is enhanced, and thereby leading to higher excess hole electron and hole charge (i.e. plasma) at the cathode side of the drift region 4. This results in a lower on-state voltage drop for a given current density.

According to the aforementioned embodiments of the present invention, there is provided an IGBT device 1 where the collection of holes is partially blocked by or made resistively via a first bipolar pnp transistor 30a in the form of a low gain pnp transistor during the on-state of the IGBT device circuit.

According to the aforementioned embodiments of the present invention, there is provided an IGBT device 1 where the first bipolar pnp transistor 30a is largely bypassed during the off-state and turn-off of the IGBT device 1.

The devices according to various embodiments of this invention are used in power electronic applications with voltage ratings from 200 V to 10 kV and a more common range of 600 V to 3.3 kV. The current rating depends on the number of individual cells placed in parallel or individual devices placed in parallel and can range from 1 A to 10,000 A with a typical range of 10 A to 800 A. An example of the dimensions and doping levels of a 1.2 kV device as shown in FIG. 6 is described below:

For a punch-through device, and referring to FIG. 6, the p+ substrate 2, is the wafer itself, has a thickness of typically 300-500 microns and is typically doped between $10^{18}$ cm$^{-3}$ and $5 \cdot 10^{18}$ cm$^{-3}$. The n-buffer 3 has a typical thickness of 5 to 15 microns and is typically doped between $10^{15}$ cm$^{-3}$ and $5 \cdot 10^{16}$ cm$^{-3}$. The n-drift region 4 has a thickness of 100 to 150 microns and a doping level of $10^{13}$ cm$^{-3}$ and $5 \cdot 10^{14}$ cm$^{-3}$. This layer 4 is supposed to block virtually all the high voltage during the blocking mode of the device. For a punch-through device, at 1.2 kV, the n− drift region 4 is completely depleted of carriers and the buffer layer 3 stops the advancement of the depletion region towards the p+ substrate 2. The depth of the trenches where the first and second gates, 5 and 6 respectively, are formed is typically between 4 to 8 microns. The gate oxide has a thickness of typically 0.1 microns. The deep p well 9 is typically 3 to 5 microns deep and has a surface concentration of $5 \cdot 10^{16}$ cm$^{-3}$ and $5 \cdot 10^{17}$ cm$^{-3}$. The n well 10 is 2 to 4 microns deep and has a surface concentration of $8 \cdot 10^{16}$ cm$^{-3}$ and $8 \cdot 10^{17}$ cm$^{-3}$. The shallow p well 14 is typically 1 to 3 microns deep and has a surface concentration of $1 \cdot 10^{17}$ cm$^{-3}$ and $1 \cdot 10^{18}$ cm$^{-3}$. The n+ 8 and p+ 8 are highly doped, of the order of $1 \cdot 10^{19}$ cm$^{-3}$ to $1 \cdot 10^{21}$ cm$^{-3}$ and they are shallow, typically below 1 micron. The pre-formed p-type channel is very shallow, typically bellow 200 nm, and has an average concentration of $5 \cdot 10^{15}$ cm$^{-3}$ and $5 \cdot 10^{16}$ cm$^{-3}$. The polysilicon inside the trench gates, 5 and 6, is also highly doped with p-type or n-type impurities and of the order of $1 \cdot 10^{19}$ cm$^{-3}$ to $1 \cdot 10^{21}$ cm-3. The cell pitch is typically 4 to 15 microns depending on the photolithographic process, the technological limits and the general performance of the device. The threshold voltage of the n-channel MOSFET is between 4 to 8 V. Below this voltage the n-channel MOSFET and the IGBT are off. The typical on-state voltage applied between the gate and the cathode (i.e. gate voltage) is 10 to 15 V, well above the threshold voltage of the n-channel MOSFET. The threshold voltage of the depletion mode p-channel MOSFET (i.e. pre-formed channel) is greater than 0 V and typically 1 to 4 V, preferably bellow the threshold voltage of the n-channel MOSFET. Below this threshold voltage the depletion mode p-channel MOSFET is on, allowing hole transport from the n-drift region 4 and deep p well 9 via the pre-formed channel 12. This is of help during the turn-off, as excess holes are rapidly removed from the n-drift region 4 and deep p well 9 when the gate voltage drops bellow the threshold voltage of the depletion mode p-channel MOSFET.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An insulated gate bipolar transistor (IGBT) device, comprising:
    a p+ substrate;
    a cathode terminal;
    an anode terminal;
    a p+ cathode short region;
    a n+ cathode region;
    an n well;
    a deep p well;
    a n− drift region;
    a first gate;
    a second gate;
    a p+ diffusion region;
    a p+ layer;
    a metal plug; and
    a pre-formed hole channel, disposed at a surface of the n well underneath the second gate, constituting a p-channel depletion-mode MOSFET with the p+ cathode short region, the p+ diffusion region and the n well, wherein the first gate is a trench gate, a part of a n-channel MOSFET, and the second gate is a planar gate adjacent to the cathode terminal, a part of the p-channel depletion-mode MOSFET; and the first gate and the second gate are coupled together and are at a potential referred to that of the cathode terminal.

2. The IGBT device as claimed in claim 1, further comprising an n buffer layer disposed between the p+ substrate and the n− drift region.

3. The IGBT device as claimed in claim 1, wherein upon an application of a common 0V to the first gate and the second gate, or a voltage larger than 0V but lower than the threshold voltage of the p-channel depletion-mode MOSFET, the n-channel MOSFET is turned OFF and the p-channel depletion-mode MOSFET is turned ON, thereby allowing access for hole draining from the deep p well during the turn-off mode, and the potential of the deep p well is clamped to that of the cathode terminal during the off-state mode.

4. The IGBT device as claimed in claim 1, further comprising:
   a first bipolar pnp transistor, formed using the deep p well as the emitter, the n well as the base, and the p+ cathode short region as the collector layer, wherein the gain of the first bipolar pnp transistor is controlled by controlling the thickness and doping of the base of the first bipolar pnp transistor and the injection efficiency of the deep p well/n well junction.

5. The IGBT device as claimed in claim 4, wherein a lower gain is obtained through increasing the doping and the width of the n well for lowering the base transport factor.

6. The IGBT device as claimed in claim 4, wherein a lower gain is obtained through decreasing the doping of the deep p well for reducing the injection efficiency.

7. The IGBT device as claimed in claim 4, wherein during turn-off of the IGBT or in the off-state the holes escape through the path of the pre-formed hole channel that is effectively placed in parallel with the first bipolar pnp transistor.

8. The IGBT device as claimed in claim 4, wherein in the on-state of the IGBT, the hole current is inhibited by the first bipolar pnp transistor being active, and the first bipolar pnp transistor is placed at the top side of the n– drift region.

9. The IGBT device as claimed in claim 1, wherein the deep p well is connected to the ground potential via the pre-formed hole channel and the p+ cathode short region.

\* \* \* \* \*